United States Patent
Peters et al.

(10) Patent No.: US 8,750,653 B1
(45) Date of Patent: Jun. 10, 2014

(54) INFRARED NANOANTENNA APPARATUS AND METHOD FOR THE MANUFACTURE THEREOF

(71) Applicant: Sandia Corporation, Albuquerque, NM (US)

(72) Inventors: David W. Peters, Albuquerque, NM (US); Paul Davids, Albuquerque, NM (US); Darin Leonhardt, Albuquerque, NM (US); Jin K. Kim, Albuquerque, NM (US); Joel R. Wendt, Albuquerque, NM (US); John F. Klem, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/871,708

(22) Filed: Apr. 26, 2013

Related U.S. Application Data

(63) Continuation-in-part of application No. 12/871,334, filed on Aug. 30, 2010, now Pat. No. 8,452,134.

(51) Int. Cl.
*G02B 6/00* (2006.01)

(52) U.S. Cl.
USPC .......................................................... 385/12

(58) Field of Classification Search
USPC .......................................................... 385/12
See application file for complete search history.

(56) References Cited

U.S. PATENT DOCUMENTS

| | | | |
|---|---|---|---|
| 2013/0115413 A1* | 5/2013 | Eres et al. | 428/120 |
| 2013/0148194 A1* | 6/2013 | Altug et al. | 359/350 |
| 2013/0153767 A1* | 6/2013 | Savoy et al. | 250/338.1 |
| 2014/0045209 A1* | 2/2014 | Chou et al. | 435/34 |

* cited by examiner

*Primary Examiner* — Sung Pak
(74) *Attorney, Agent, or Firm* — Martin I. Finston

(57) ABSTRACT

An exemplary embodiment of the present invention is a photodetector comprising a semiconductor body, a periodically patterned metal nanoantenna disposed on a surface of the semiconductor body, and at least one electrode separate from the nanoantenna. The semiconductor body comprises an active layer in sufficient proximity to the nanoantenna for plasmonic coupling thereto. The nanoantenna is dimensioned to absorb electromagnetic radiation in at least some wavelengths not more than 12 μm that are effective for plasmonic coupling into the active layer. The electrode is part of an electrode arrangement for obtaining a photovoltage or photocurrent in operation under appropriate stimulation.

23 Claims, 23 Drawing Sheets

INFRARED NANOANTENNA APPARATUS AND METHOD FOR THE MANUFACTURE THEREOF

CROSS-REFERENCE TO RELATED APPLICATIONS

This application is a Continuation-in-Part of U.S. patent application Ser. No. 12/871,334 entitled FREQUENCY SELECTIVE INFRARED SENSORS and filed on Aug. 30, 2010, which application is incorporated by reference in its entirety.

The subject matter of this application is related to the subject matter of U.S. patent application Ser. No. 13/871,676 entitled FREQUENCY SELECTIVE INFRARED SENSORS and filed on the filing date hereof, which application is a Divisional application of the above said U.S. patent application Ser. No. 12/871,334.

This invention was developed under Contract DE-AC04-94AL85000 between Sandia Corporation and the U.S. Department of Energy. The U.S. Government has certain rights in this invention.

TECHNICAL FIELD

The present invention is directed generally to frequency selective infrared (IR) sensors and focal plane arrays (FPAs), and, more particularly, to frequency selective IR sensors and FPAs that include a frequency selective surface plasmonic (FSSP) structure.

BACKGROUND OF THE INVENTION

The infrared (IR) spectral region is of interest for a number of reasons. For example, the frequency peak of the blackbody radiation spectrum at room temperature is at ~30 THz. Thus, at typical ambient temperatures objects continually exchange energy with the radiation field at IR frequencies. Therefore, there is significant information about properties such as the temperature, emissivity, etc. of objects in our environment contained in the IR radiation field.

At night, this radiation may be used to visualize the environment and to find particularly "hot" objects—such as, for example, people and engines. This application has made the IR spectral region important for defense applications, leading the military to have had a long-standing focus on improving infrared technology.

Additionally, the atmosphere is somewhat transparent in two different IR spectral windows (MWIR: mid-wave IR ~60-100 THz, and LWIR: long-wave IR ~25-40 THz), making these ranges particularly interesting.

Furthermore, many common molecular vibrations are in the IR, e.g., the vibrational mode of a hydrogen molecule is ~120 THz and the C-H stretch vibration (of interest because most organic compounds have a signature in this frequency range) is ~90 THz, while heavier and more complex molecules have signatures at lower frequencies. For example the P—O stretch, that is a signature of many nerve agents, is ~30 THz.

Therefore, there is, and will continue to be, significant interest in detecting and monitoring radiation across the IR spectral range and new methods and sensors for performing these functions are continually sought. Exemplary embodiments of the present invention include frequency selective IR photodetectors, rectennas, focal plane arrays, and waveguide sensors to help meet the demand for various forms of frequency selective IR sensors.

SUMMARY OF THE INVENTION

An exemplary embodiment of the present invention is apparatus comprising a photodetector, the photodetector comprising a semiconductor body, a periodically patterned metal nanoantenna disposed on a surface of the semiconductor body, and at least one electrode separate from the nanoantenna. The semiconductor body comprises an active layer in sufficient proximity to the nanoantenna for plasmonic coupling thereto. The nanoantenna is dimensioned to absorb electromagnetic radiation in at least some wavelengths not more than 12 μm that are effective for plasmonic coupling into the active layer. The electrode is part of an electrode arrangement for obtaining a photovoltage or photocurrent in operation under appropriate stimulation.

In embodiments, the apparatus is conformed as a focal plane array, the semiconductor body is subdivided into pixels, and the electrode arrangement is conformed to provide an output signal containing image information.

In embodiments, the active layer is interposed between and adjacent to two layers of semiconductor material having a greater bandgap than the active layer.

In embodiments, the semiconductor body comprises an epitaxially grown stack of multiple semiconductor layers.

In embodiments, the nanoantenna comprises a plurality of periodic unit cells, each unit cell comprises one or more unit patterns, and each unit pattern is dimensioned with one or more dimensions selective for a particular peak absorptive wavelength.

In another aspect, embodiments of the invention involve a method for making a photodetector, including steps of epitaxially growing a sequence of semiconductor layers on a sacrificial semiconductor substrate to form a semiconductor stack, bonding the semiconductor stack to a handling substrate, removing the sacrificial substrate, and before or after removing the sacrificial substrate, depositing and patterning a metal nanoantenna on the semiconductor stack.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION

Exemplary embodiments of the present invention include frequency selective infrared (IR) photodetectors, focal plane arrays, and waveguide sensors that incorporate a frequency selective surface (FSS) based on surface plasmon wave (SPW) resonance.

Plasmonic structures open up new opportunities in photonic devices, sometimes offering an alternate method to perform a function and sometimes offering capabilities not possible with standard optics. For example, exemplary FSSs of the present invention are metal (metal-like) coatings on optical surfaces that do not substantially adversely affect the transmission of those surfaces in the design frequency band. This technology may be applied as an RF noise-blocking layer across an optical aperture or as a method to apply an electric field to an active electro-optic device without affecting optical performance.

These exemplary IR optical antennas may be used in exemplary photodetectors. Furthermore, in other exemplary embodiments of the present invention, these structures may be electrically coupled with other components to provide direct rectification of IR radiation, which may lead to new methods of IR detection and energy harvesting of IR radiation.

Figure 1:
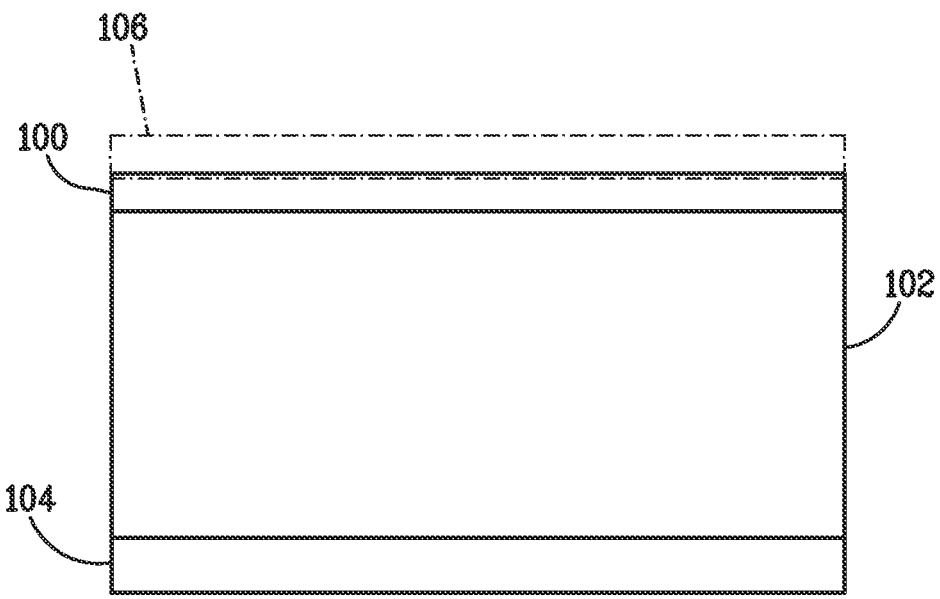
FIG. 1 is a side plan drawing of an exemplary frequency selective infrared (IR) photodetector according to the present invention.

FIG. 1 illustrates an exemplary frequency selective IR photodetector, according to the present invention. This exemplary frequency selective IR photodetector has a predetermined frequency band, which may desirably be in the range of about 20 THz to about 40 THz. The exemplary frequency selective IR photodetector of FIG. 1 includes: dielectric IR absorber 102; frequency selective surface plasmonic (FSSP) structure 100 formed on the second surface of the dielectric IR absorber 102; and electrode 104 which is electrically coupled to the surface of dielectric IR absorber 102 opposite from FSSP structure 100. This exemplary frequency selective IR photodetector may also include wavelength selective thin film reflector layer 106 formed on the outer surface of FSSP structure 100.

Dielectric IR absorber 102 may be formed of any dielectric absorber material that efficiently absorbs IR radiation in the desired frequency band of the exemplary frequency selective IR photodetector. The use of common dielectric IR absorber materials such as: group IV semiconductor materials (e.g. Si or Ge); II/VI or II/VII semiconductor materials (e.g. HgCdTe); or III/V semiconductor materials (e.g. GaAs), may be desirable to allow manufacture of the exemplary device to use established techniques; however, other material such as, e.g. organic semiconductors, may be used as well.

It may be desirable for dielectric IR absorber 102 to be approximately a quarter-wave thick for IR radiation at the peak frequency of the desired frequency band to provide adequate absorption of incident IR radiation, i.e.:

$$t_{absorber} = c/4n_{ave}f_{peak} \qquad \text{Equation 1,}$$

where: $t_{absorber}$ is the thickness of dielectric IR absorber 102; c is the speed of light in vacuum; $n_{ave}$ is the average index of refraction of dielectric IR absorber 102; and $f_{peak}$ is a peak frequency of the predetermined frequency band. Additionally, electrode 104 may desirably be reflective to radiation in the desired frequency band.

Dielectric IR absorber 102 is desirably fabricated to include a traditional photodetector structure. Such structures include: bulk photoconductor structures (N-type or P-type); P-N photodiode structures; P-I-N photodiode structures; and multiple quantum well detector structures. A wavelength selective thin film reflector layer may also be formed as part of dielectric IR absorber 102, desirably adjacent to the surface on which FSSP structure 100 is formed.

FSSP structure 100 is designed to selectively transmit radiation in the predetermined frequency band that is incident on the FSSP structure substantially independent of the angle of incidence of the incident radiation on the FSSP structure.

Frequency selective surface structures have been used at microwave frequencies; however, these structures have not been used previously in IR systems. Exemplary embodiments of the present invention include FSSP structures specifically designed to operate in the IR band. These exemplary FSSP structures allow a patterned conductive layer (PCL) to be added to a surface without substantially increasing reflection at the design frequency or significantly affecting the transmission of the surface. This ability functions over a broad angular range from normal to near grazing incidence. These structures involve SPWs, whose properties may be exploited for a number of unique applications, such as those exploited in the various exemplary embodiments of the present invention.

For, example, such an exemplary structure may be designed to block electrical noise without affecting the performance of an exemplary optical device at the design frequency band of the FSSP structure. This treatment of the surface may be compatible with other surface treatments such as multi layer dielectric anti reflection coatings and, thus, may be used in conjunction with them. This type of FSSP structure may also be used as the electrical contacts directly on top of an electro-optic device while not blocking the optical signal of interest. Additionally, unlike many surface treatments (such as multilayer dielectric reflectors), this exemplary FSSP structure is remarkably angularly independent.

FSSP structure 100 includes a connected conductive layer with a periodic array of apertures. This patterned conductor layer (PCL) may be formed of any material capable of supporting SPWs without excessive dissipation, such as, e.g.: gold; aluminum; copper; silver; platinum; titanium; tungsten; an alloy or combination thereof; high temperature superconductors; or metal superconductors. It is desirable for the PCL to be thick enough that very little of the energy of the incident IR radiation may be directly transmitted through the PCL without the intermediary of being coupled into SPW modes of the PCL, but not so thick as to substantially affect transmission of the energy of the incident IR radiation in the desired frequency band through the PCL indirectly using the intermediary of the SPW modes of the PCL. As may be understood by one skilled in the art, the desired thickness of this PCL may be determined based on a number of factors of the specific FSSP structure desired, such as: the electrical properties on the PCL material; the desired frequency band; and which surface(s) of the FSSP structure the resonant SPWs are intended to propagate on.

FSSP structure 100 may also include an adhesion layer between dielectric IR absorber 102 and the PCL. This adhesion layer may be patterned as well, although this is not necessary. Additionally, FSSP structure 100 may further includes insulating material filling gaps in the PCL. This insulating material, which may be composed of a dielectric material similar to the dielectric material of dielectric IR absorber 102, may be particularly desirable if wavelength selective thin film reflector layer 106, or another optional structure is to be formed on the outer surface of FSSP structure 100.

Figure 2:
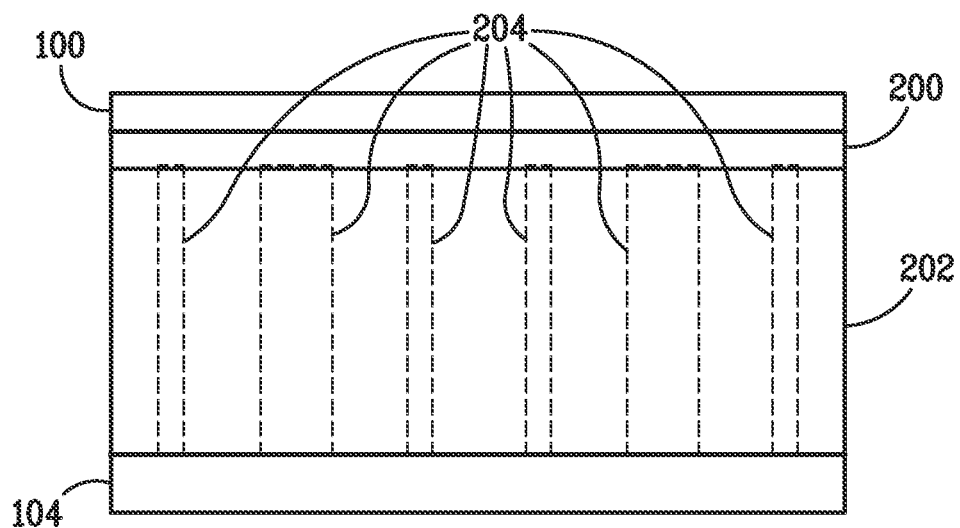
FIG. 2 is a side plan drawing of an exemplary frequency selective IR rectenna according to the present invention.
Figure 3A:
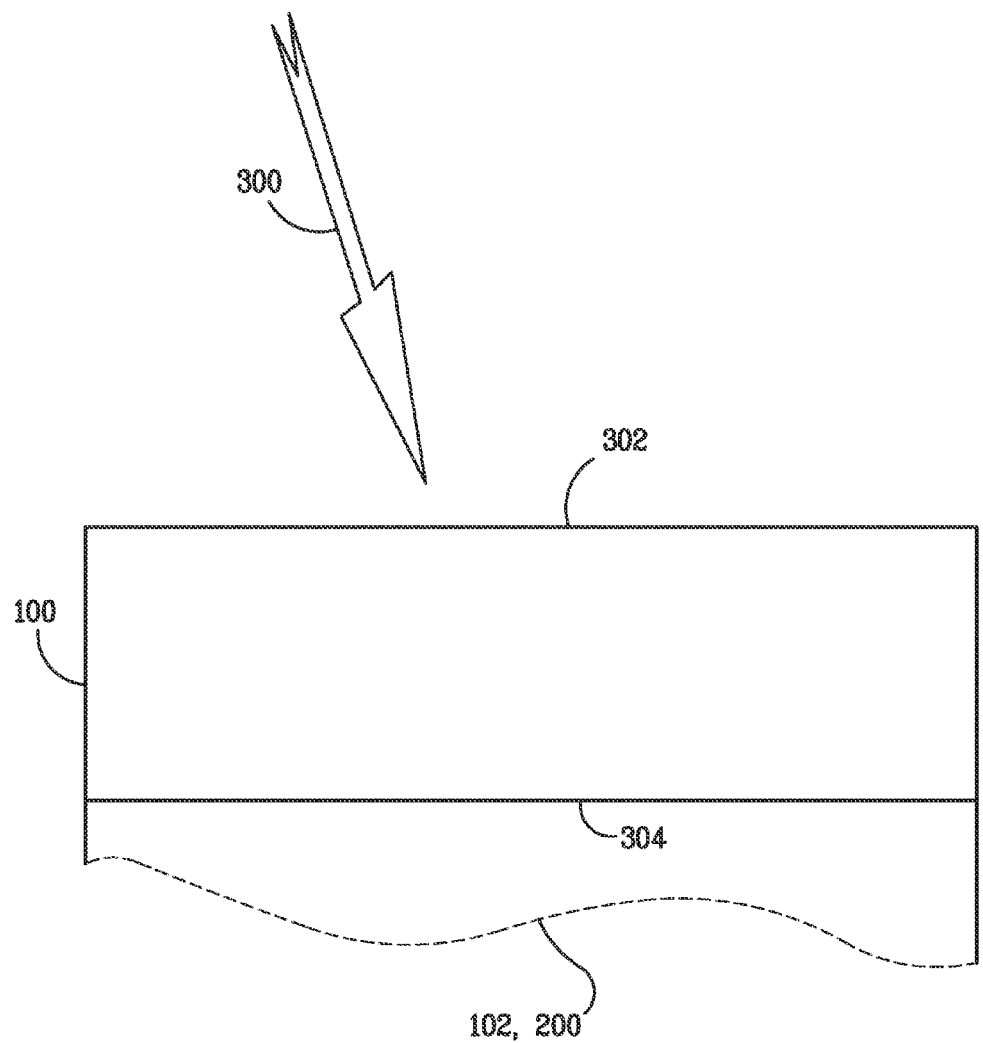
FIG. 3A is a side plan drawing illustrating incident IR incident on the exemplary frequency selective surface (FSS) of the exemplary embodiments of FIGS. 1 and 2.

As illustrated in FIG. 3A, IR radiation 300 may generate resonant SPWs on one or both of outer surface 302 and/or inner surface 304 of FSSP structure 100, which is in contact with dielectric absorber 102 in the exemplary embodiment of FIG. 1 (or thin film insulating layer 200, as described below with respect to the exemplary embodiment of FIG. 2).

The periodic array of apertures forming the PCL of FSSP structure 100, includes a two dimensional array of substantially identical square unit cells, each unit cell having a side length, $l_{unit}$, such that $$l_{unit} < c/2nf_{peak} \qquad \text{Equation 2,}$$

where: c is the speed of light in vacuum; n is the index of refraction of the dielectric IR absorber 102 at surface 304; and $f_{peak}$ is a peak frequency of the desired frequency band. Thus, the PCL of FSSP structure 100 desirably has a design SPW resonance that is approximately equal to the peak frequency of the predetermined frequency band of the exemplary frequency selective IR photodetector. It is noted that Equation 2 also illustrates that the features of the PCL have subwavelength dimensions. Therefore, the effects of FSSP structure 100 on steady-state IR radiation do not include diffraction effects.

Additionally, it is noted that it may be desirable for the IR absorbing material of dielectric IR absorber 102 to have a bandgap energy approximately equal to the photon energy of IR radiation having a lowest frequency of the predetermined frequency band. In this way, FSSP structure 100 may act as a low pass filter and dielectric IR absorber 102 may act as a high pass filter to define the desired frequency band of the exemplary frequency selective IR photodetector of FIG. 1.

It is contemplated that FSSP structure 100 may be multilayer including multiple PCLs with intervening layers of dielectric. However, as discussed above, IR FSSP structures offer challenges not encountered in the microwave regime. For example, due to increased metal loss in this frequency band, there may be a trade-off between possible improved frequency selectivity gained by having multiple PCLs with intervening layers of dielectric and potential signal loss associated with each PCL.

Figures 3B, 3C:
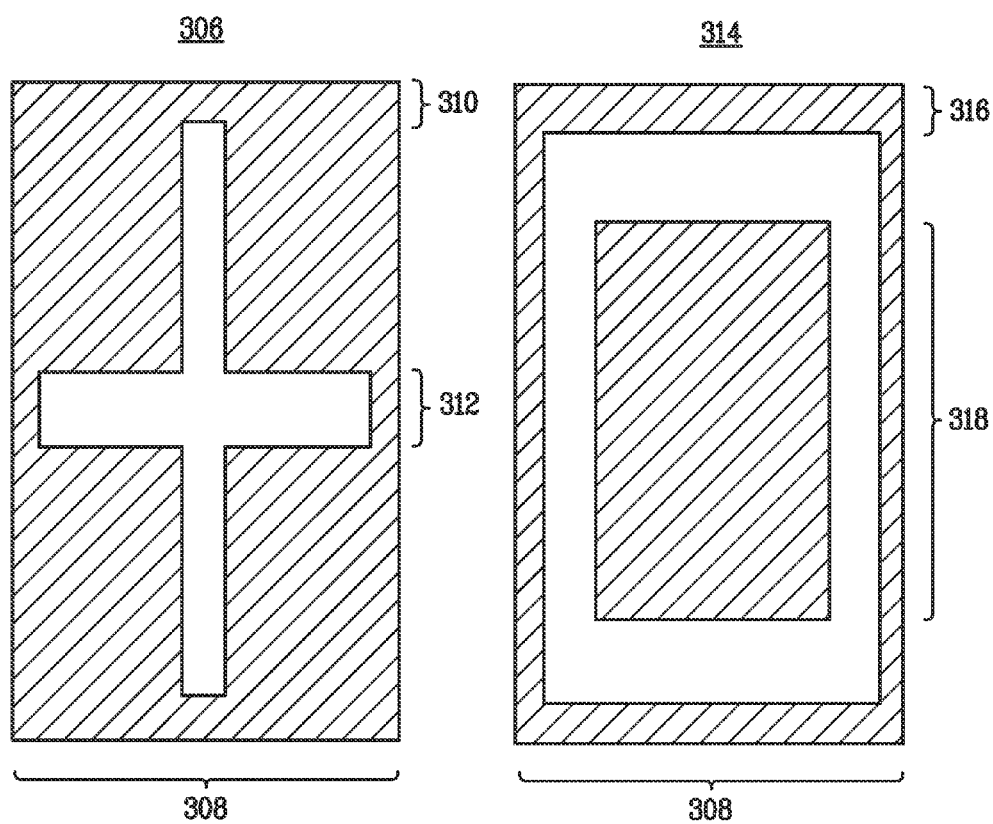
FIGS. 3B and 3C are top plan drawings of two different exemplary unit cells that may be tiled to form the exemplary FSS of FIG. 3A.

FIGS. 3B and 3C illustrate two exemplary unit cell designs for PCLs in exemplary FSSP structure 100. These two unit cell designs are intended as merely exemplary and are not intended to be limiting. FIG. 3B illustrates cruciform unit cell pattern 306. This unit cell design includes three dimensions that may be varied to affect the spectrum of resonant SPWs on a PCL formed of an array of cruciform unit cells. One convenient basis of these dimensions is illustrated in FIG. 3B: cell side length 308; separation distance 310; and cross thickness 312.

FIG. 3C illustrates square loop unit cell pattern 314. This unit cell design also includes three dimensions that may be varied to affect the spectrum of resonant SPWs on a PCL formed of an array of square loop unit cells. One convenient basis of these dimensions is illustrated in FIG. 3C: cell side length 308; mullion width 316, and middle square side length 318.

FIG. 2 illustrates another embodiment of the present invention, an exemplary frequency selective IR rectenna, which has a predetermined frequency band in the IR band, desirably is in the range of about 160 THz to about 400 THz.

This exemplary frequency selective IR rectenna includes: FSSP structure 100; electrically insulating thin film layer 200, which is coupled to FSSP structure 100; electrically insulating via layer 202, which is coupled to electrically insulating thin film layer 200; via conductors 204, which are formed in vias through electrically insulating via layer 202; and electrode 104, which is electrically coupled to via conductors 204.

In the exemplary frequency selective IR rectenna of FIG. 2, FSSP structure 100 is substantially similar to the FSSP structure of the exemplary frequency selective IR photodetector of FIG. 1, and is designed to selectively convert incident radiation in the predetermined frequency band into SPWs on a surface of FSSP structure 100 substantially independent of the angle of incidence of the incident radiation on the FSSP structure. As described above with respect to exemplary frequency selective IR photodetectors of FIG. 1, it is contemplated that multilayer FSSP structures include multiple PCLs, adhesion layers, and/or thin film dielectric reflectors 106 may be used in exemplary frequency selective IR rectenna of FIG. 2.

In the exemplary frequency selective IR rectenna of FIG. 2, the oscillating electric field intensities of the SPWs propagating on surface 304 of FSSP structure 100 are coupled to via conductors 204 across electrically insulating thin film layer 200. The PCL of FSSP structure 100 desirably has a design SPW resonance for SPWs propagating on inner surface 304 (illustrated in FIG. 3A) that is approximately equal to a highest frequency of the desired frequency band. As in the exemplary frequency selective IR photodetector of FIG. 1, this design SPW resonance may desirably be achieved in the exemplary frequency selective IR rectenna of FIG. 2 using a PCL that is formed of an array of substantially identical square unit cells. If FSSP structure 100 and via conductors 204 are formed of materials with differing work functions, FSSP structure 100, electrically insulating thin film layer 200, and each via conductor 204 may function as an M-I-M diode structure, effectively rectifying the IR signal to provide a unidirectional electric current to be emitted from the exemplary frequency selective IR rectenna. It is noted that it may also be desirable for electrode 104 to be formed of the same material as via conductors 204. In addition to functioning as an IR detector, this exemplary design may provide an efficient method for harvesting energy from IR radiation sources.

Figure 4:
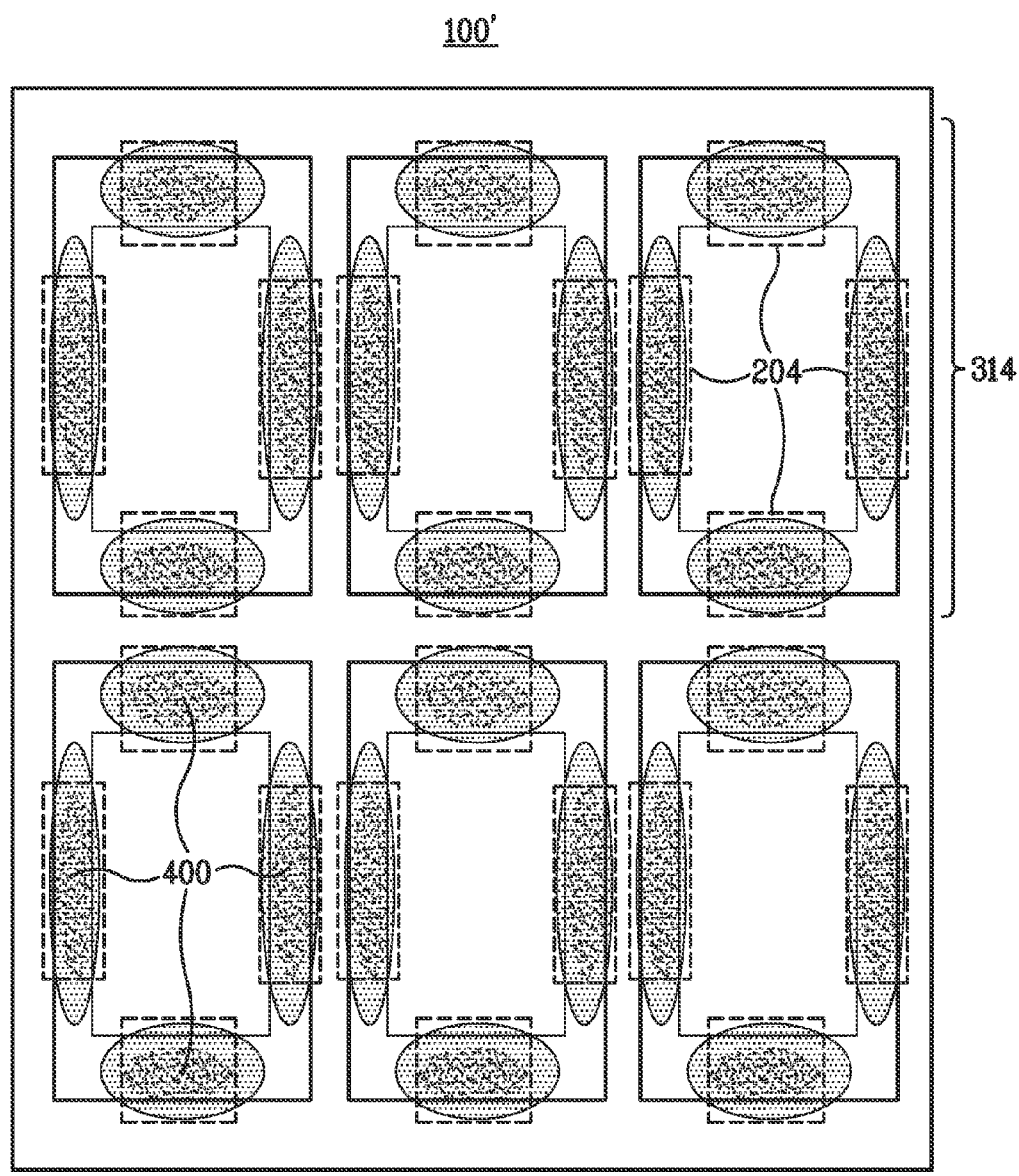
FIG. 4 is a top plan drawing of an exemplary FSS illustrating an exemplary correspondence of resonant surface plasmon wave (SPW) intensity on the exemplary FSS and the placement of via conductors in the exemplary rectenna of FIG. 2.

FIG. 4 illustrates exemplary FSSP structure 100', which includes a 3×2 array of square loop unit cells 314 as shown in FIG. 3C. FIG. 4 also illustrates, as shaded areas 400, regions of peak standing wave intensity for exemplary resonant SPWs propagating on a surface of exemplary FSSP structure 100'. FIG. 4 further illustrates as dashed-line boxes an exemplary positioning of the vias in electrically insulating via layer 202, and thus via conductors 204, of the exemplary frequency selective IR rectenna of FIG. 2.

Using the exemplary positioning of FIG. 4, via conductors 204 may be desirably aligned with the regions of peak standing SPW intensity 400, providing for improved coupling of energy from the SPWs into electrical signals. It is noted that regions of peak standing SPW intensity 400 may be out of phase with respect to each other. However, in the case where FSSP structure 100 and via conductors 204 are formed of materials having different work functions, these phase differences do not adversely affect the coupling of energy from the SPWs into electrical signals, owing to the resulting rectification of the electric signal.

In the foregoing discussion, we have described frequency selective surface plasmonic (FSSP) structures intended for various applications. An FSSP structure may, in particular, include an infrared-sensitive nanoantenna disposed on a semiconductor substrate for purposes of detection or imaging. We will now describe several such devices that are sensitized by nanoantennas for use in focal plane arrays (FPAs) or for other applications involving the detection of infrared radiation. Some of the exemplary devices provided below may be of the nBn or pBp detector type.

Figure 5:
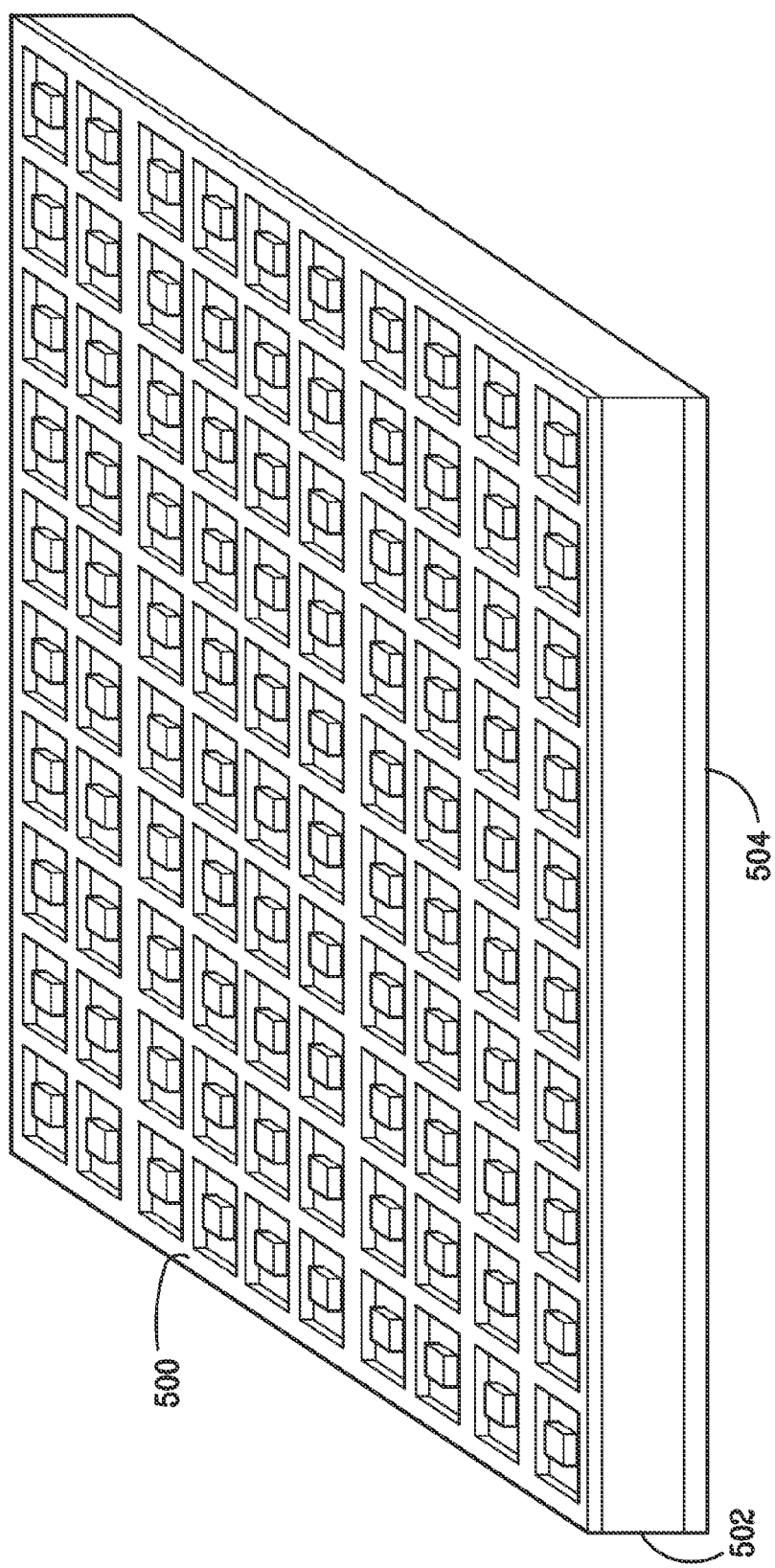
FIG. 5 is a partially schematic perspective view of a pixel for focal plane array according to one exemplary embodiment.

FIG. 5 provides one example of a pixel for an FPA in which a nanoantenna 500 on the front surface is coupled to an underlying semiconductor layer 502 that is backed by a metal backplane 504. Typical dimensions for such a device are 100 nm for the thickness of the nanoantenna, 100-200 nm for the total thickness of the semiconductor layer, and 100 nm for the thickness of the metal backplane. These dimensions should be understood as illustrative and not limiting. Likewise, although it will be seen that the nanoantenna in the pixel as illustrated is patterned in a 10×10 two-dimensional array of square-loop unit cells, it should be understood that the number of unit cells and the choice of a square-loop pattern are purely illustrative.

Figure 6A:
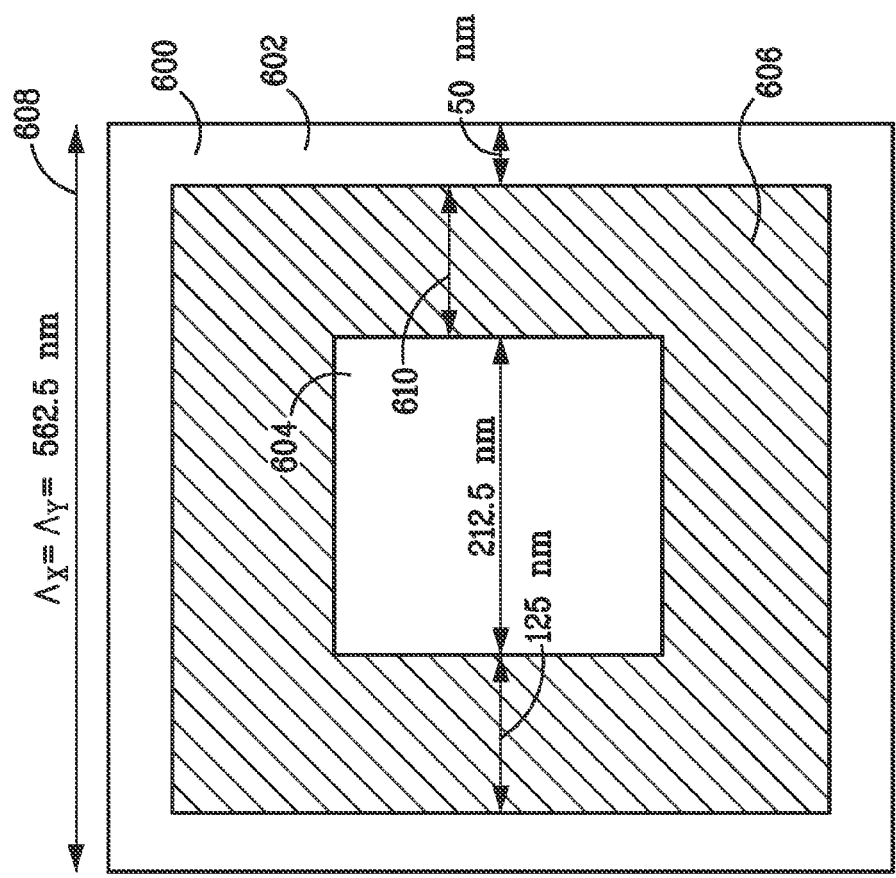
FIG. 6A provides a top-down plan view of one unit cell of the nanoantenna of FIG. 5.

FIG. 6A provides a top-down plan view of one unit cell of the nanoantenna of FIG. 5. As seen in the plan view of the figure, the unit cell incudes one nanoantenna unit 600 which in turn consists of outer loop 602 and inner patch 604, both formed on semiconductor layer 606. It will be seen further that in the example provided by the figure, the unit cell is a square of side length (called out by reference numeral 608) 562.5 nm, patch 604 is a square of side length 212.5 nm, and the patch and the outer loop are so formed as to leave gap 610 between them, of width 125 nm. In the following discussion, we will refer to the width of gap 610 as the "aperture" of the nanoantenna.

The dimensions provided above, together with further dimensions to be provided below, were used in numerical simulations that will be described in the following discussion. In addition to the 125-nm aperture, we also performed simulations using an aperture of 150 nm, which are also reported below.

Figure 6B:
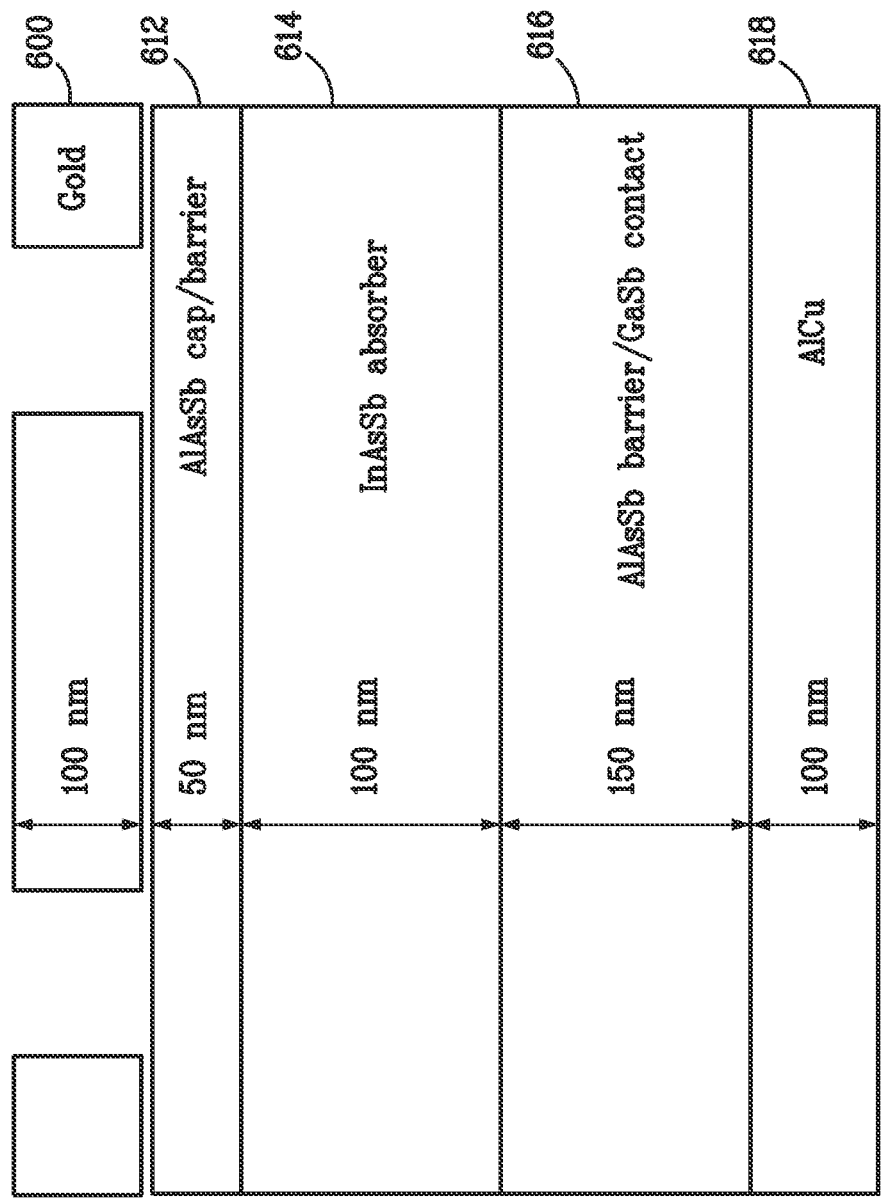
FIG. 6B is a partially schematic side elevational view, in cross section, providing further details of the unit cell of FIG. 6A and of the underlying semiconductor body.

The elevational view of FIG. 6B provides further details of the unit cell of FIG. 6A and of the underlying semiconductor body. As seen in the figure, the nanoantenna is gold of thickness 100 nm, the underlying semiconductor body is a multi-layer stack 612-616 having a total thickness of 300 nm, and the backplane is a metal layer of aluminum-copper of thickness 100 nm. The nanoantenna serves as the front electrode for the device, and the backplane serves as the back electrode. In operation, the electrode pair provides an output signal in the form of a photovoltage or photocurrent.

An antireflection coating is omitted from the structure of FIGS. 6A and 6B because we believe that a well-designed nanoantenna will provide very efficient coupling of incident infrared radiation into the surface plasmon modes.

The ability to design a detector structure without the need for antireflection coatings on the detector surface becomes increasingly important for an array in which different pixels respond to different spectral bands. The nanoantenna at each pixel can be optimized for that band, and thus zero reflection can be achieved at every pixel irrespective of the wavelength it is collecting. This is not generally feasible to implement in a practical way with thin films, where a single compromise coating is typically applied across all pixels. Moreover, the wavelength band of the nanoantenna passband does not change with angle. This allows the collection of the same passband over a broad angular range, whereas with thin films there is generally a corresponding change in the passband with a change in angle.

The respective semiconductor layers 612-616 are assumed to be epitaxially grown. Significantly, we have included both optically absorbing and optically non-absorbing layers in the semiconductor stack for two reasons: First, the nanoantenna design is optimized for a certain optical thickness between the two metal layers. Although earlier design approaches might have filled the entire thickness with active semiconductor, we found that a better tradeoff is obtained by reducing the volume of active semiconductor because this also reduces the amount of dark current. Second, we found that a "barrier" or "passivation" layer of non-absorbing semiconductor material is advantageously interposed between the active layer and the electrodes because direct contact of the active layer with metal can promote the recombination of photogenerated carriers and increase dark current, both of which can degrade the performance of the detector.

More specifically, the passivation layer is useful in this regard because it terminates the chemical bonds of the absorber material at its surface. If left unterminated, dangling chemical bonds can generate dark current by thermal and surface-conduction mechanisms. Although various other approaches may be possible, the type of material we have chosen in our designs for the passivation layer is a semiconductor having a higher bandgap than the absorber, but having a lattice constant similar to that of the absorber. We note in this regard that, as is well-known in the art, a representative sequence of III-V compounds in order of decreasing bandgap is: AlSb, AlAsSb, GaSb, InAsSb, InGaAsSb.

We have made a similar material choice for the barrier layer, which may in fact be the same material as the passivation layer, although the use of identical materials is not critical. In the designs presented here, the barrier layer serves as a barrier to the conduction of electrons that would otherwise contribute to dark current.

The material of the absorber and the material of the contact layer may be the same, although the use of identical materials is not critical.

Accordingly, the semiconductor stack shown in FIG. 6B includes upper barrier layer 612 of 50-nm AlAsSb, active absorber layer 614 of 100-nm InAsSb, and 150-nm lower layer 616, which is a composite of an AlAsSb barrier layer and a 50-nm GaSb contact layer.

The optical design for the nanoantenna structure of FIGS. 6A and 6B was performed using a suite of electromagnetic codes. Rigorous coupled wave analysis (RCWA) was used for a first-pass design. In the square-loop design, the period and relative width of the outer gold lines, aperture, and central gold square were variable. Parameter values were set in RCWA to center the absorption peak at the desired wavelength. Because RCWA is not the optimal way to determine where the absorption is occurring in the structure, further modeling was performed using finite difference time domain (FDTD) and/or finite-element modeling (FEM) simulations. Understanding the spatial dependence of absorption is important as absorption can occur in both the gold nanoantenna and the active layer. Our goal was to maximize absorption in the active layer where carriers are generated and not in the gold layer where only phonons are generated.

Figure 6C:
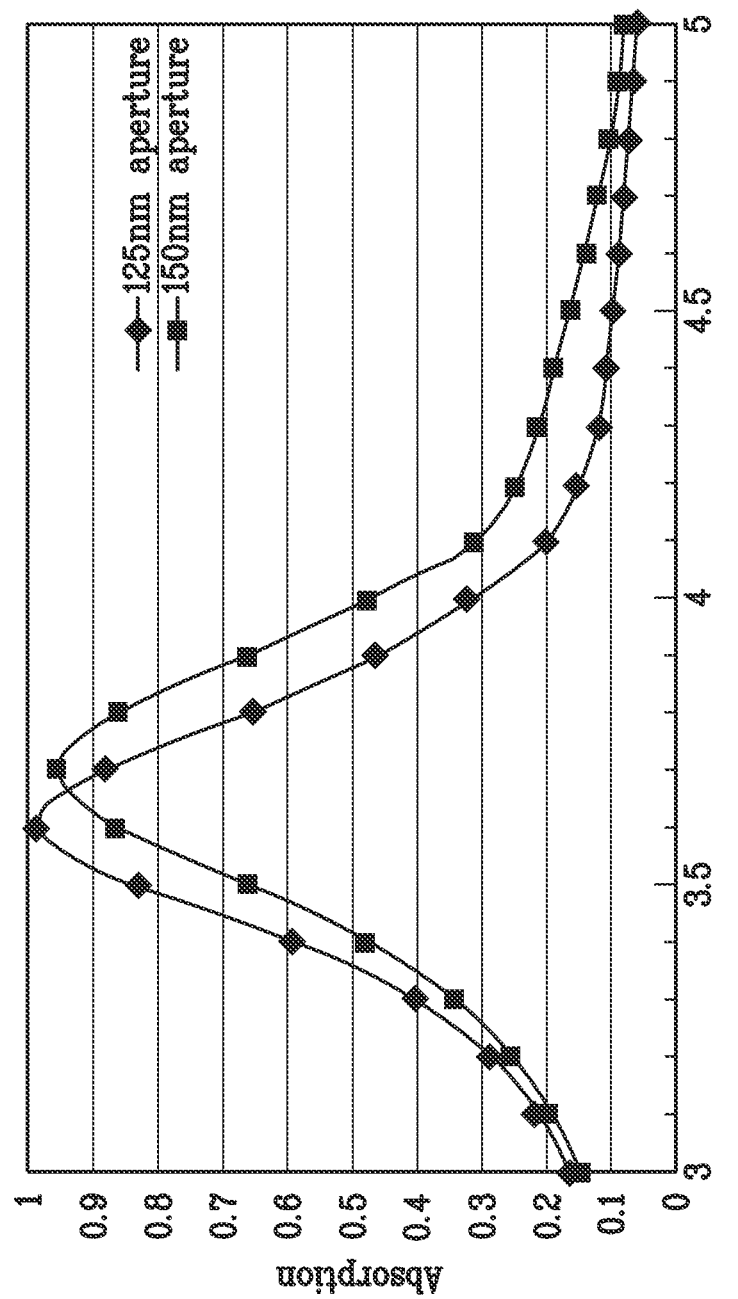
FIG. 6C is a comparative graph of simulation results showing the total absorption of the nanoantenna array of FIGS. 6A and 6B as a function of wavelength for different apertures.

FIG. 6C provides simulation results showing the total absorption at normal incidence of the nanoantenna array as a function of wavelength for an aperture of 125 nm (left-hand curve) and for an aperture of 150 nm (right-hand curve), with the same unit cell period in both cases. It will be seen that even without changing the period of the unit cell, the center wavelength of the absorption spectrum can be shifted by adjusting other lateral parameters of the structure, such as the aperture. Here, for example, increasing the aperture by 20% caused a shift in the center wavelength of about 0.1 µm, i.e., about 3%.

With further reference to FIGS. 6A-6C, it will be seen that although the optical length of the cavity formed by the semiconductor stack is approximately one-quarter the peak absorptive wavelength, the thickness of the active absorber layer is substantially less; indeed, in the present example the active absorber layer is only one-third the total cavity length. Accordingly, in view of the design tradeoffs discussed above, we believe that good performance will often be obtained using active absorber layers of actual thickness that is one-fourth or less the peak absorptive wavelength as measured within the active material (i.e., the vacuum wavelength divided by the index of refraction of the active absorber). In some cases, we believe that a fraction as small as one-third, one-fifth, one-tenth, or an even less will suffice.

We believe that by appropriate scaling of designs such as that described above, it will be possible to provide useful detection by this means of infrared radiation not only in the mid-wavelength (MWIR) region of the infrared spectrum (2-5 µm) as exemplified here, but also in the long-wavelength (LWIR) region (8-12 µm), and by careful design even into spectral regions below 3 µm. In fact, our numerical simulations have shown that operation at a wavelength as small as 1.55 µm or less is theoretically possible using a germanium-based detector. One example of a germanium-based detector will be provided below with reference to FIGS. 13A-13C. With appropriate material choices, we believe that designs can be made for feasible operation over a spectral range extending from the visible to the thermal infrared regions.

Figure 7:
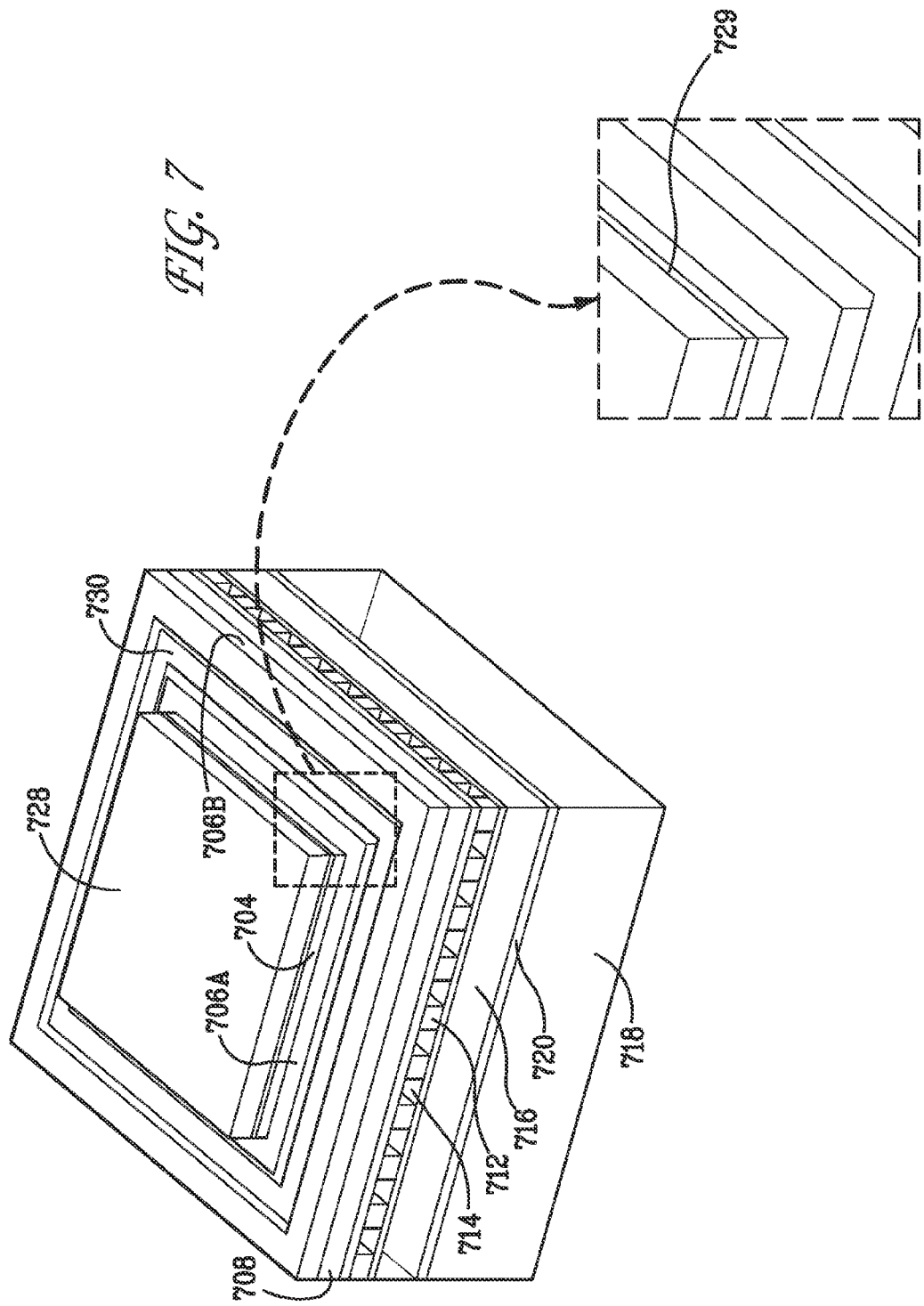
FIG. 7 is a partially schematic perspective view of one exemplary design for a pixel of a nanoantenna-sensitized detector.

FIG. 7 provides a modified design for a detector pixel, which is the object of a fabrication sequence described below with reference to FIGS. 8a-8n. As seen in the figure, a unit cell of the completed device includes p-doped GaSb contact layer 704, an AlGaAsSb barrier layer 706 shown as having an inner portion 706A and an outer portion 706B divided by a trench, InAsSb active absorber layer 708, gold nanoantenna 712, silicon nitride encapsulant 714, benzocyclobutene (BCB) adhesion layer 716, sapphire handle 718, silicon nitride layer 720, gold backplane electrode 728 underlain (as best seen in the inset) by thin titanium contact layer 729, and gold front electrode 730 which is deposited within the trench on the back surface (i.e. the upward-facing surface as seen in the figure) of absorber layer 708.

Figure 8A:
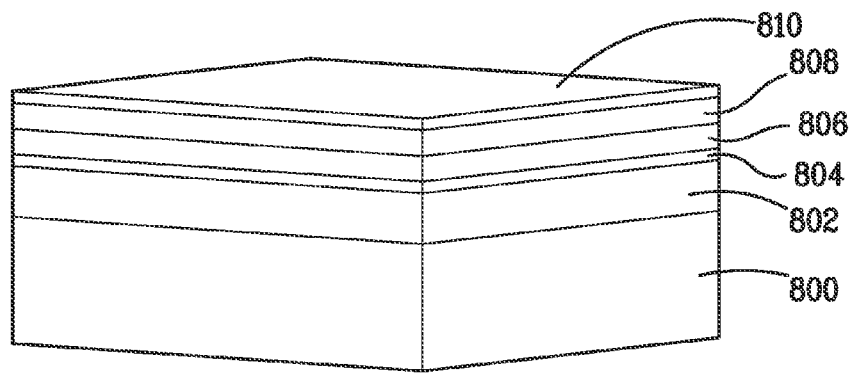
FIGS. 8a-8n are partially schematic perspective views of intermediate stages in the fabrication of the device of FIG. 7 according to one exemplary fabrication sequence.
Figure 8B:
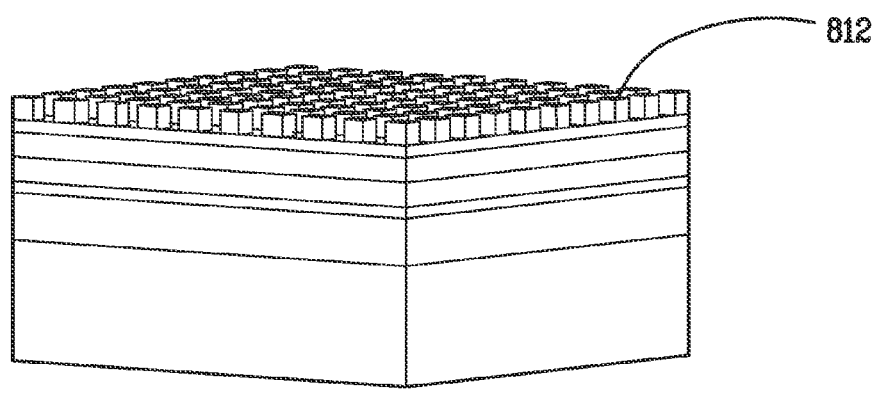
Figure 8C:
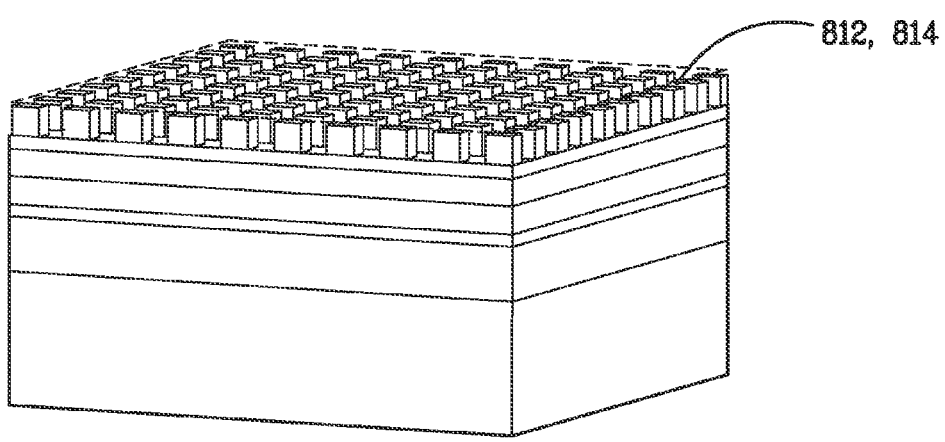
Figure 8D:
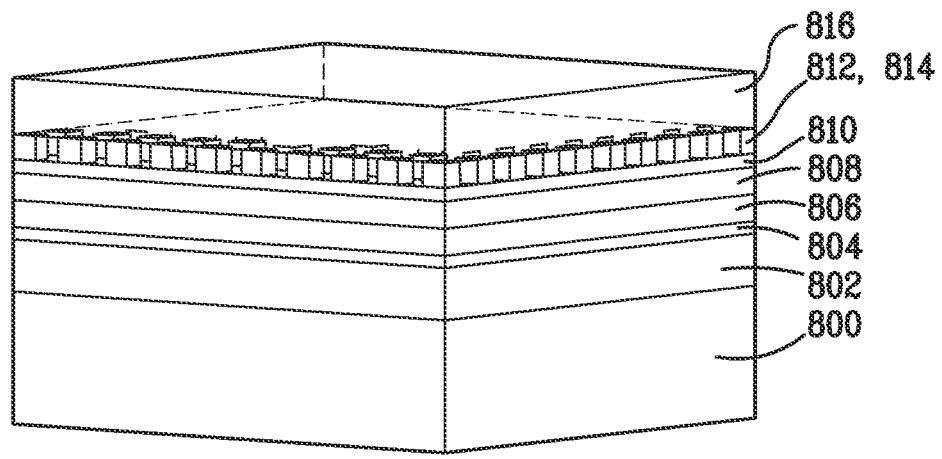
Figure 8E:
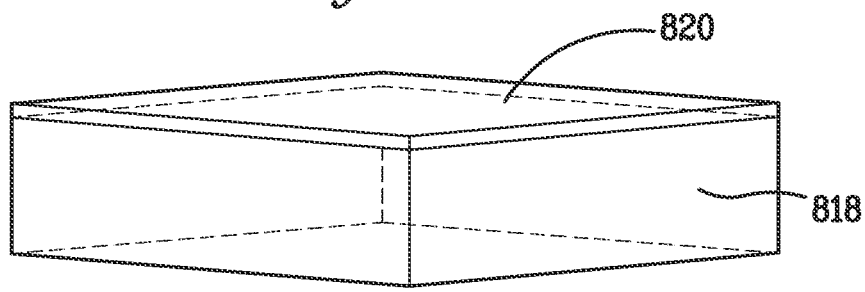
Figure 8F:
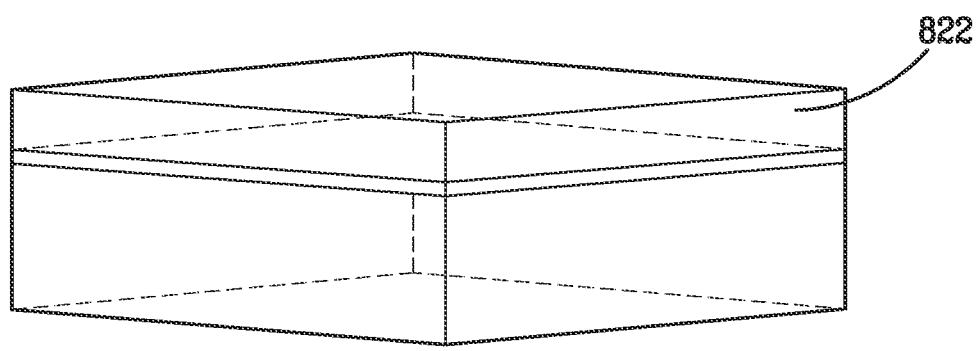
Figure 8G:
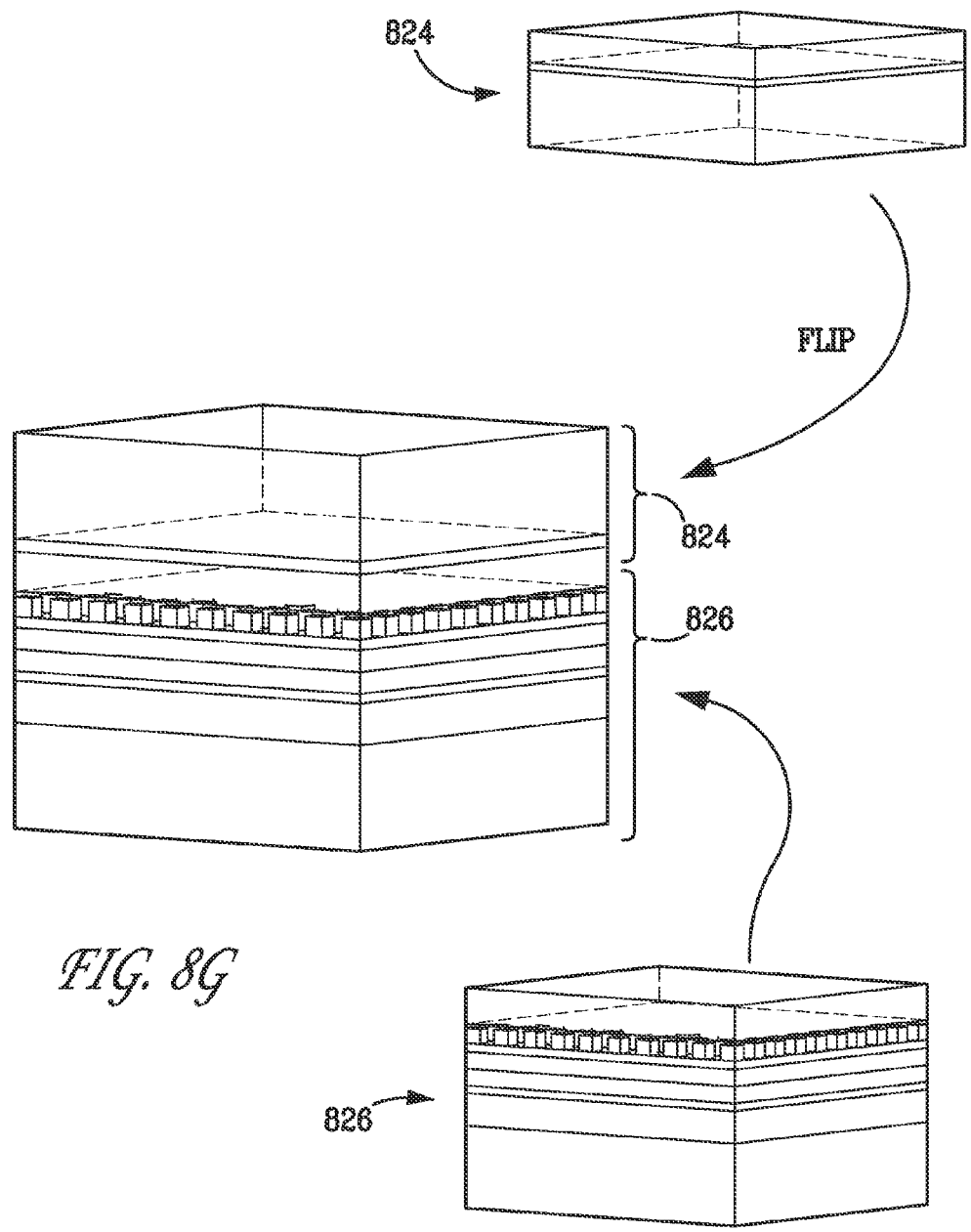
Figure 8H:
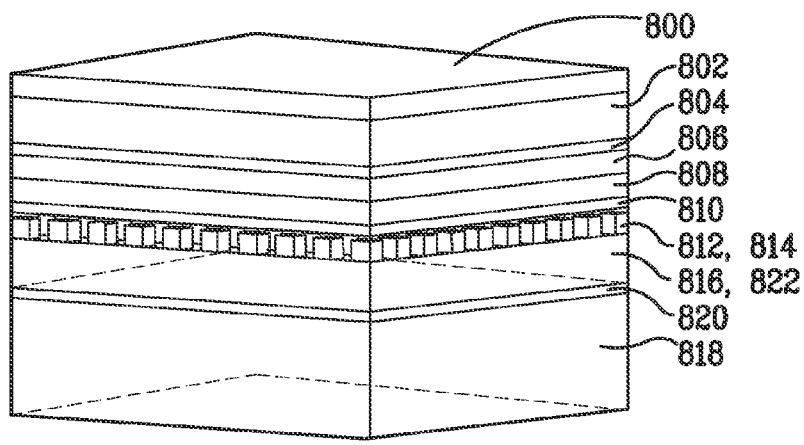
Figure 8I:
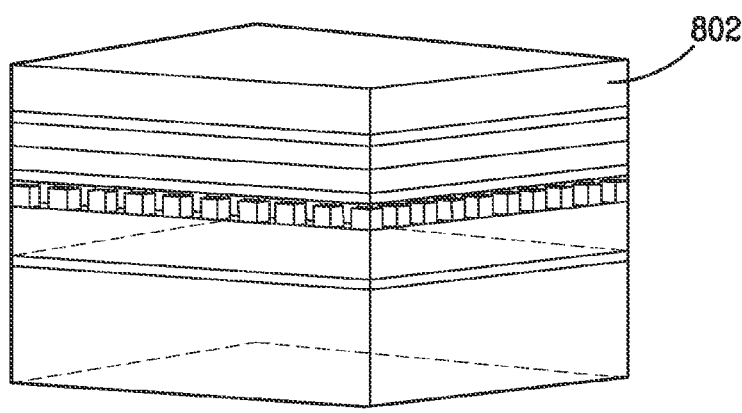
Figure 8J:
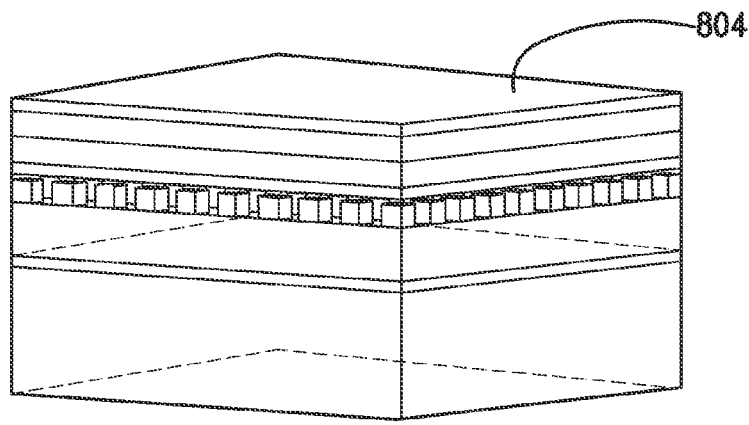
Figure 8K:
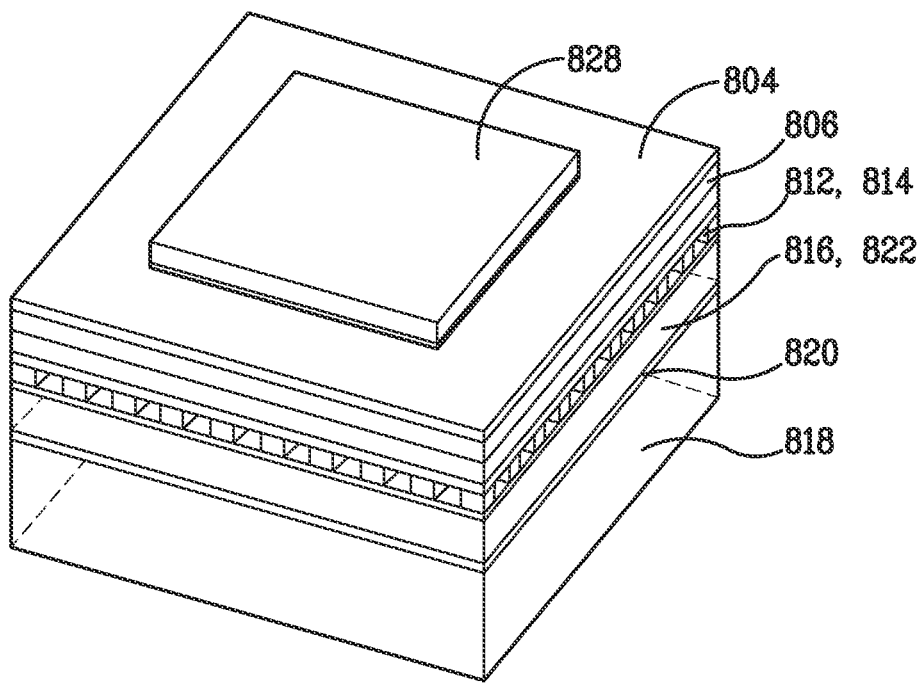
Figure 8L:
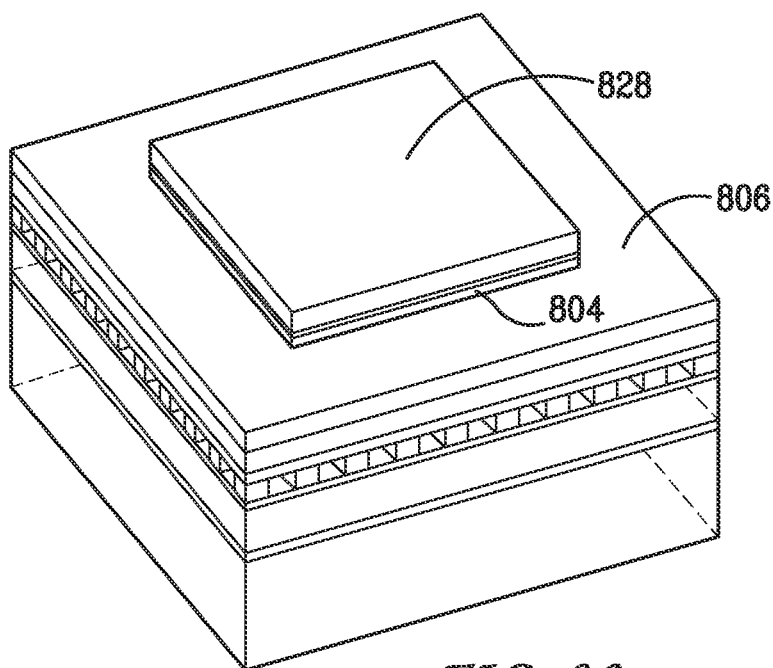
Figure 8M:
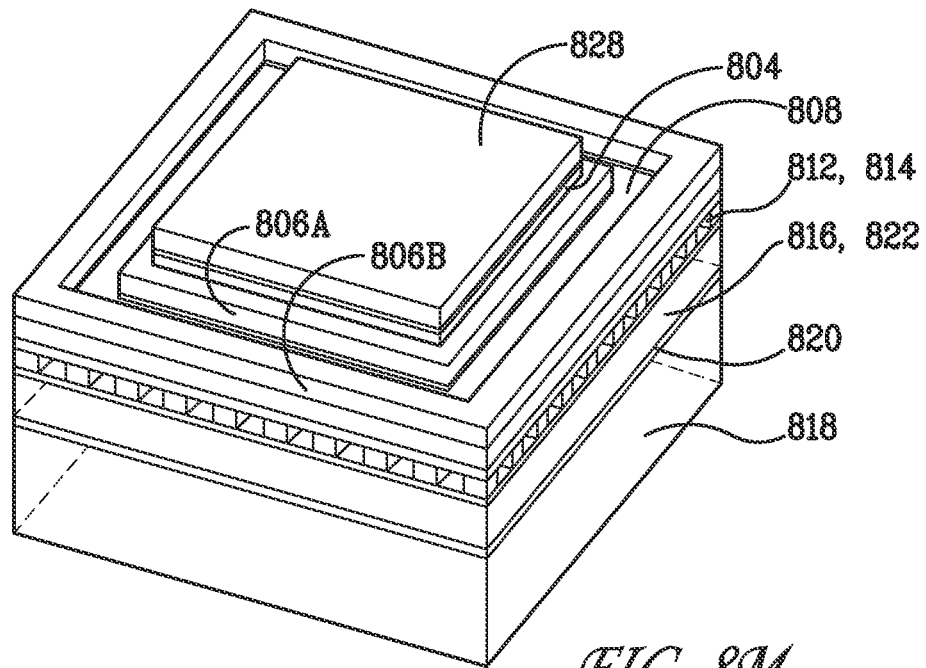
Figure 8N:
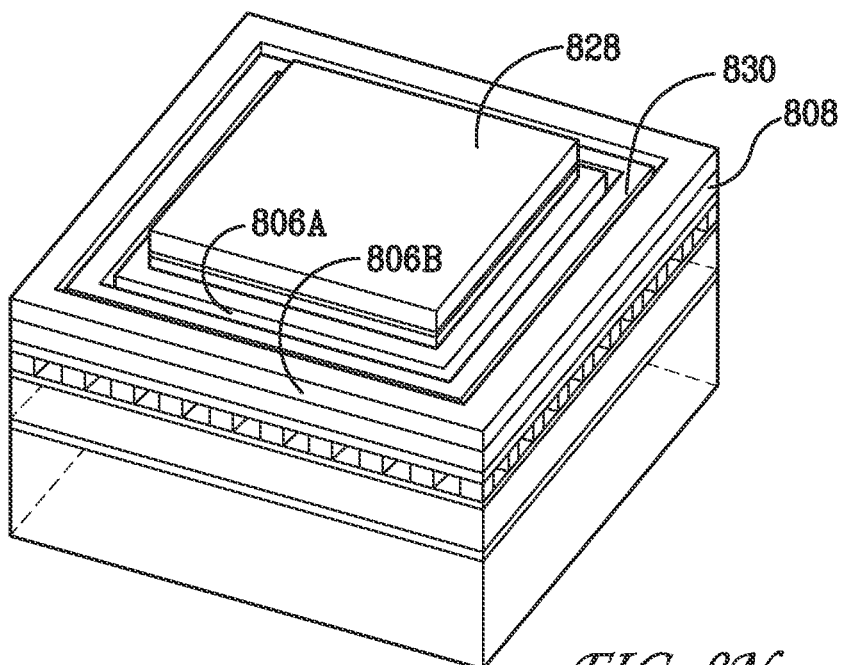

With reference to FIGS. 8a-8n, we will now describe one example of a fabrication sequence directed to making the structure of FIG. 7.

Step 1, FIG. 8a. On GaSb substrate 800, there are epitaxially grown 100-nm InAsSb etch stop layer 802, 50-nm $AlGa_{0.15}AsSb$ absorber passivation layer 810, 100-nm InAsSb absorber 808, 100-nm $AlGa_{0.15}AsSb$ electron barrier 806, and 50-nm p-type GaSb contact layer 804.

Step 2, FIG. 8b. Nanoantenna (NA) fabrication is done on the absorber passivation layer 810 using e-beam lithography. The nanoantenna 812 is 100-nm gold.

Step 3, FIG. 8c. Nanoantenna 812 is encapsulated with layer 814, which consists of 3000 Å of $Si_3N_4$. The nitride provides a well-defined environment surrounding the antenna, and it provides an adhesion layer for the BCB layer described below.

Step 4, FIG. 8d. BCB layer 816 is spin coated onto the nitride layer 814.

Step 5, FIG. 8e. On a separate workpiece, coating 820 of 1000 Å of $Si_3N_4$ is deposited onto c-sapphire handle piece 818 to promote BCB adhesion.

Step 6, FIG. 8f. BCB is spin coated onto silicon nitride layer 820 on the sapphire workpiece.

Step 7, FIG. 8g. The nanoantenna workpiece 826 and the sapphire handle workpiece 824 are heated to 170° C., i.e., past the glass transition point of the BCB. The two pieces are then joined by their respective BCB layers, pressed together into intimate contact, and slowly cooled to room temperature.

Step 8, FIG. 8h. The GaSb substrate 800 is then lapped and polished to 50-µm thickness.

Step 9, FIG. 8i. The remaining 50 µm of GaSb substrate 800 is chemically etched away in a solution of citric acid and chromium trioxide, with the etch stopping on InAsSb etch-stop layer 802.

Step 10, FIG. 8j. The InAsSb etch stop layer 802 is selectively removed in a solution of citric acid and hydrogen peroxide, stopping on the p-type GaSb layer 804.

Step 11, FIG. 8k. The pixel fabrication begins by defining titanium-gold metal contact 828 on the surface of GaSb layer 804.

Step 12, FIG. 8l. The contact metal of contact 828 acts as a self-aligned etch mask for the removal of the surrounding portions of GaSb layer 804, so as to electrically isolate each pixel. The exposed portions of GaSb layer 804 are removed in a solution of citric acid and hydrogen peroxide, stopping on $AlGa_{0.15}AsSb$ electron barrier layer 806.

Step 13, FIG. 8m. Contact to active absorber layer 808 is initiated with an etch that defines trenches around the pixels that extend a shallow distance into the absorber 808. The solution of dilute HF is used to etch through the $AlGa_{0.15}AsSb$ electron barrier, while a solution of citric acid and hydrogen peroxide is used to etch into the absorber 808.

Step 14, FIG. 8n. The absorber contact metal 830 is deposited using a lift-off process.

We have found that integration of the nanoantenna in close proximity to the active absorber layer presents several fabrication challenges. One fabrication process involves patterning the nanoantenna first. This ensures a flat, unadulterated surface for the e-beam processing.

For nanoantenna-first processing, the expitaxial layers are grown on the GaSb substrate in reverse order compared to the normal sequence for detector epitaxial layer design. We found that adding 15% Ga to the wide gap AlAsSb is effective in preventing oxidation of the layer when exposed to air. The absorber layer is near the surface, covered only by a thin, unintentionally doped wide-band gap semiconductor that acts as a surface passivation for the absorber. The passivation layer is critical for a thin absorber where surface and interfacial carrier generation and recombination effects can dominate the detector performance.

As noted above, the nanoantenna wafer and handle wafer are bonded together with BCB. We have found that the BCB must be fully cured in nitrogen ambient during the bonding process so that the bonded epilayers remain flat and stable after substrate removal. If the BCB is not fully cured, the epitaxial layers develop buckling and delamination during subsequent processing steps. Additionally, bubbles may form in the BCB.

We also found that the nanoantenna metal can potentially spike through the thin passivation layer and contaminate the absorber at the elevated temperatures required during the BCB cure. We have found that a thin layer of titanium beneath the gold of the nanoantenna and above the $AlGa_{0.15}AsSb$ passivation layer can be effective in preventing gold from reacting with the passivation layer during the BCB bonding process.

We encountered difficulty in attempting to wirebond to the top contact of the fabricated detectors. Our ball-and-wedge bonding process resulted in tearing of the metal pads. Apparently, this problem results from the delicate condition of the epilayers bonded with the BCB. One possible solution is to displace the contact pads for the wire bonds horizontally away from the detectors. An alternative approach described below, in which the detector is integrated with a Read-Out Integrated Circuit (ROIC), may avoid the wirebonding problem described above.

It should be noted that the silicon nitride encapsulant tends to decrease the unit cell dimensions for the nanoantenna for a given center absorptive wavelength, because the silicon nitride (having a refractive index of about 1.9) increases the effective refractive index in the region above the patterned gold layer.

Figure 9:
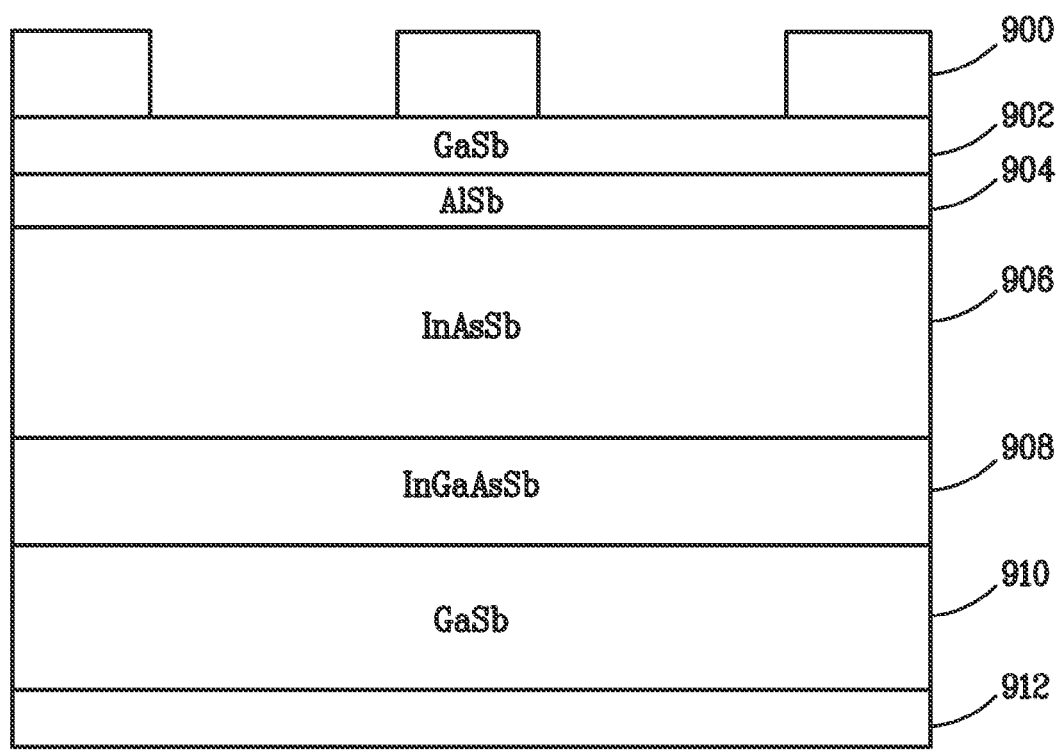
FIG. 9 is a partially schematic side elevational view, in cross section, of an exemplary unit cell for a nanoantenna-sensitized detector that is integrated with a Read-Out Integrated Circuit (ROIC).

Turning now to FIG. 9, another exemplary unit cell is configured for attachment, e.g. by flip-chip connection, to a Read-Out Integrated Circuit (ROIC). Such a configuration is especially useful for making FPAs, because the ROIC is the chip that takes the charge collected on each individual pixel in an array and generates a corresponding output signal.

As seen in the cross-sectional view of FIG. 9, one possible such unit cell includes, in sequence from front to back, 100-nm patterned metal nanoantenna 900, 50-nm GaSb passivation layer 902, 50-nm AlSb passivation layer 904, 150-nm to 250-nm InAsSb active absorber layer 906, 100-nm InGaAsSb barrier layer 908, 150-nm GaSb contact layer 910, and metallized layer 912 for contact to the ROIC (not shown).

Figure 10A:
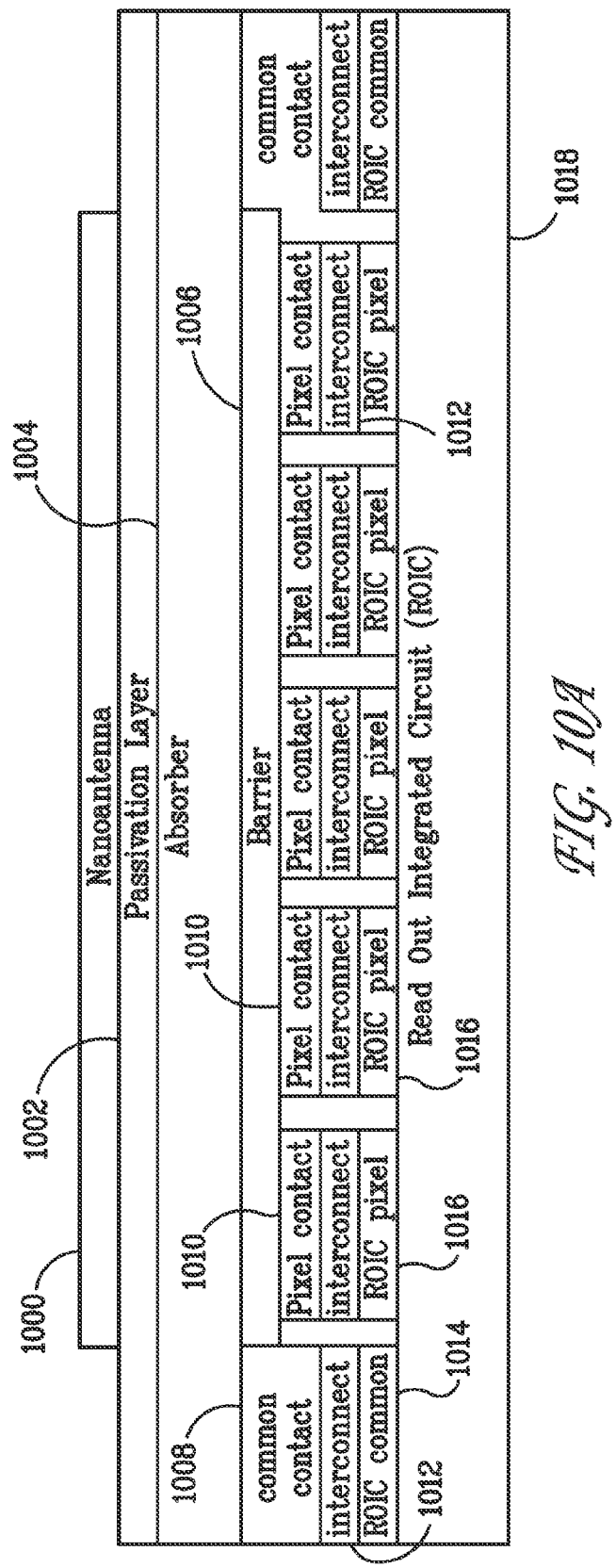
FIG. 10A is a partially schematic side elevational view, in cross section, of an exemplary unit cell for a nanoantenna-sensitized detector that is integrated with a Read-Out Integrated Circuit (ROIC), showing more detail than FIG. 9.

FIG. 10A provides a cross-sectional view, in greater detail, of an exemplary nanoantenna configuration including an ROIC. As seen in the figure, nanoantenna 1000 is formed on a semiconductor stack that includes passivation layer 1002, active absorber layer 1004, barrier layer 1006. Common contact 1008 is provided, which communicates with ROIC 1018 by way of interconnect 1012. Pixel contacts 1010 are provided, which likewise communicate with the ROIC by way of interconnect 1012. ROIC 1018, in turn, is connected through ROIC common contact 1014 and ROIC pixel contacts 1016 to the interconnect, and through the interconnect to the nanoantenna-sensitized semiconductor stack.

Selection of semiconductor materials and fabrication techniques are, e.g., as described above. It should be noted that although the nanoantenna in the embodiment of FIG. 10A is not serving as an electrode, it may be advantageous in other embodiments to employ the nanoantenna as the front electrode. This may be especially advantageous, e.g. in embodiments configured as p-n junction detectors.

It should also be noted that in some embodiments, one continuous nanoantenna may extend, without subdivision, over many, or even all, ROIC pixels. In other embodiments, the nanoantenna may be subdivided such that a different nanoantenna element serves each pixel. Generally, however, the nanoantenna unit cell will be substantially smaller than a single pixel of the array.

In embodiments in which a different nanoantenna element serves each pixel, it will in some cases be advantageous to implement pixels of different classes, each class having a nanoantenna element of a different design. Thus, for example, different classes may be designed to have different spectral responses, or different responses to polarized light.

Figure 10B:
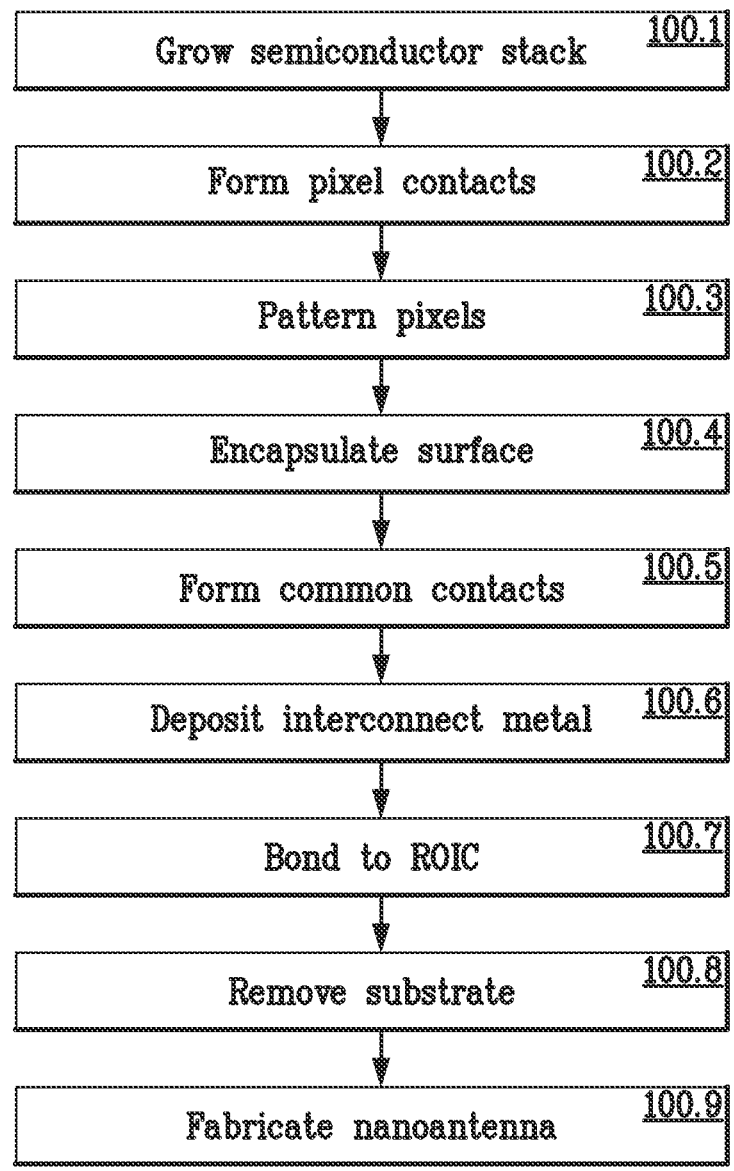
FIG. 10B is a flowchart illustrating an exemplary sequence of fabrication steps for making a detector integrated with an ROIC as shown, for example, in FIG. 10A.

We now provide, with reference to FIG. 10B, an exemplary sequence of fabrication steps for making a detector integrated with an ROIC as illustrated, for example, in FIG. 10A:

Step 100.1. On a GaSb substrate, there is epitaxially grown the following sequence: 1000-nm InAsSb etch stop layer, 50-nm GaSb layer, 50-nm $AlGa_{0.15}AsSb$ absorber passivation layer, 250-nm InAsSb absorber, 100-nm $AlGa_{0.15}AsSb$ electron barrier, and 50-nm p-type GaSb contact layer.

Step 100.2. A respective electrical contact is fabricated for each pixel.

Step 100.3. The pixels are patterned by etching through the cap layer, i.e. the GaSb contact layer, stopping within the electron barrier layer.

Step 100.4. The surface is encapsulated with a dielectric, e.g. silicon nitride or silicon dioxide.

Step 100.5. Around the perimeter of the photodetector array, common contacts are fabricated on the absorber layer by etching through the electron barrier and depositing a metal contact.

Step 100.6. Interconnect metals are deposited on each metal contact.

Step 100.7. The photodetector array is hybridized to a read-out integrated circuit (ROIC) by flip-chip bonding. The gap between the photodetector array and the ROIC is underfilled with an epoxy.

Step 100.8: The GaSb substrate and the sacrificial InAsSb etch-stop layer are removed by means of mechanical and chemical etching.

Step 100.9. Nanoantenna (NA) fabrication is done on the absorber passivation layer using e-beam lithography. The nanoantenna is 100-nm gold.

To form the pixel contacts (Steps 100.2 and 100.3), titanium-gold metal contacts are formed on the surface of the GaSb layer. The metal contacts act as a self-aligned etch mask for the removal of the surrounding portions of the GaSb layer, so as to electrically isolate each pixel. The exposed portions of the GaSb layer are removed in a solution of citric acid and hydrogen peroxide, stopping on the $AlGa_{0.15}AsSb$ barrier layer.

To form the common contacts (Step 100.5), contact to the absorber layer is initiated with an etch that defines trenches around the pixels that extend a shallow distance into the absorber. A solution of dilute HF is used to etch through the $AlGa_{0.15}AsSb$ barrier layer, and a solution of citric acid and hydrogen peroxide is used to etch into the absorber. The absorber contact metal is deposited using a lift-off process.

For substrate removal (Step 100.8), the GaSb substrate is first lapped and polished to 50-μm thickness. The remaining 50 μm of GaSb is then chemically etched away in a solution of citric acid and chromium trioxide, with the etch stopping on the InAsSb etch-stop layer. The InAsSb etch stop layer is then selectively removed in a solution of citric acid and hydrogen peroxide, stopping on the adjacent GaSb layer.

As we have noted above, the center absorptive wavelength of the nanoantenna can be shifted by changing the aperture of the nanoantenna, even if the period of the nanoantenna remains the same. Reference back to the comparative spectra of FIG. 6C will show that the bandwidth can also be changed when the aperture is changed. We have found that these effects can be harnessed to provide a nanoantenna having a substantially increased bandwidth.

Figure 11A:
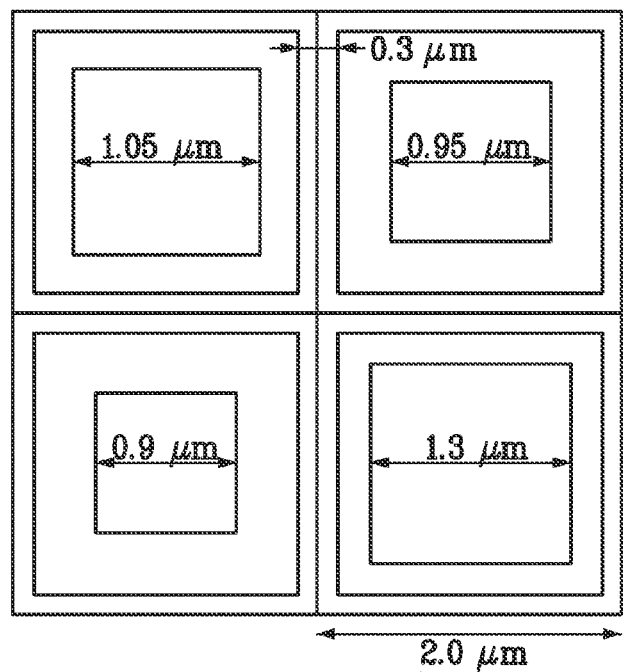
FIG. 11A is a schematic, top-down plan view of one example of a nanoantenna supercell.

For example, FIG. 11A provides one example of a nanoantenna supercell. In that example, the supercell is a square, subdivided into four individual unit cells having a common side length of 2.0 μm but each having a different aperture. Given an outer loop width of 0.15 μm (which as seen in the figure is doubled in the interior of the supercell by the adjacency of the outer loops of respective neighboring units), the respective apertures in this example are 0.2 μm, 0.325 μm, 0.375 μm, and 0.4 μm. The supercell is the basic repeating unit of the band-broadened nanoantenna array.

Figure 11B:
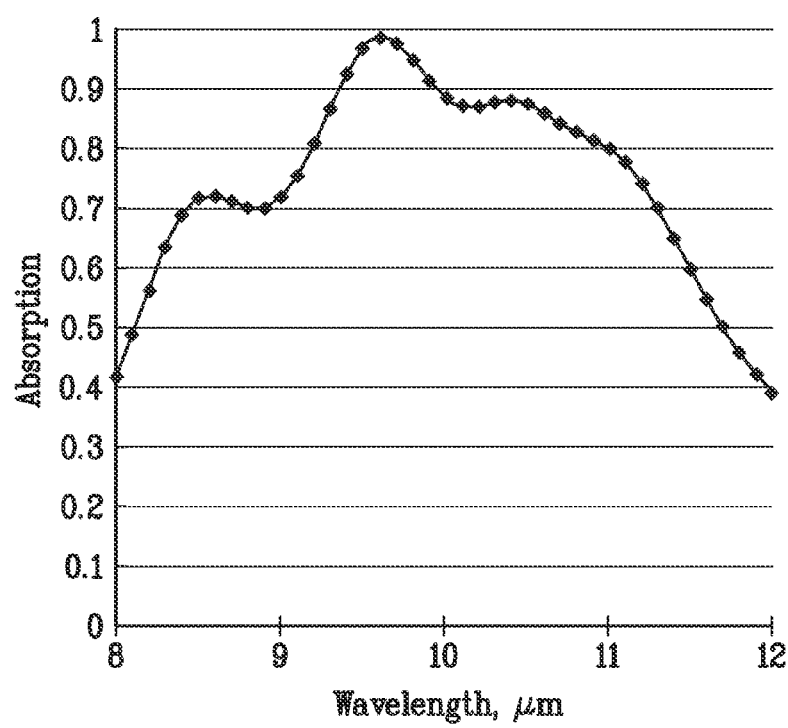
FIG. 11B is a graph showing of the absorption spectrum of the nanoantenna of FIG. 11A as obtained from numerical simulations.

To predict the spectral behavior of the nanoantenna of FIG. 11A, we performed a simulation of the same type that we performed to obtain the spectrum of FIG. 6C, based on a similar semiconductor stack. The result is provided in FIG. 11B. It will be seen that the bandwidth extends at least from 8 μm to 12 μm, thus covering substantially the whole of the thermal infrared spectrum.

Figure 12:
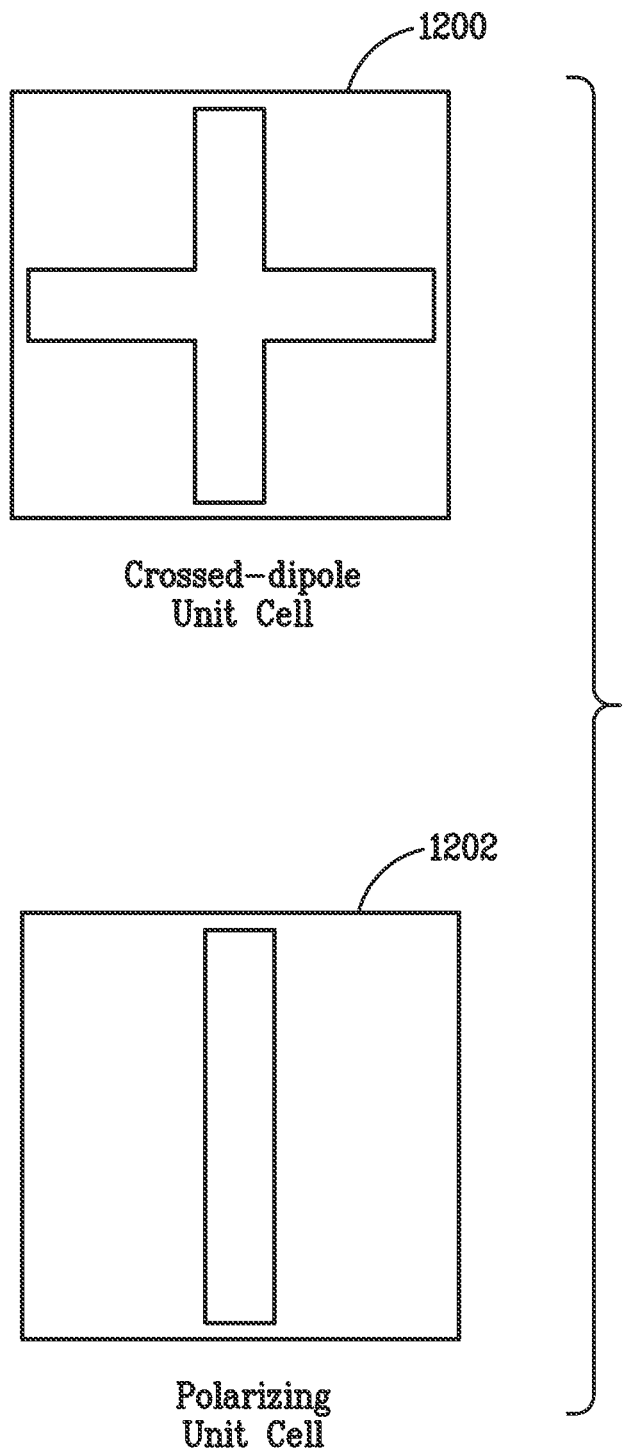
FIG. 12 provides a plan view of several alternative designs for the unit cell of a nanoantenna, specifically a crossed dipole design and a polarizing design.

Although the above-described example embodiments are based on a square loop design for the nanoantenna unit cell, it should be understood that such a design is merely exemplary, and that other shapes can be used without departing from the scope and spirit of the invention. For example, FIG. 12 provides a plan view of a crossed dipole unit cell 1200 and of a polarizing unit cell 1202. The crossed dipole may be advantageous for some applications because it tends to yield a narrower bandwidth than the square loop design. The polarizing design has a preferred direction, as will be apparent on inspection of the figure, and as a consequence will provide a response that varies with the polarization of the incident radiation. It will be understood, of course, that unit cells of different kinds can be combined into supercells to provide specialized responses of various kinds.

Although the above-described embodiments are based on a semiconductor stack consisting of semiconductors from the III-V family, it should be understood that this choice is meant to be exemplary and not limiting, and that extensions to other material systems such as mercury cadmium telluride and related compounds, and such as germanium and related compounds, is also believed to be feasible and lies within the scope and spirit of the invention.

Figure 13A:
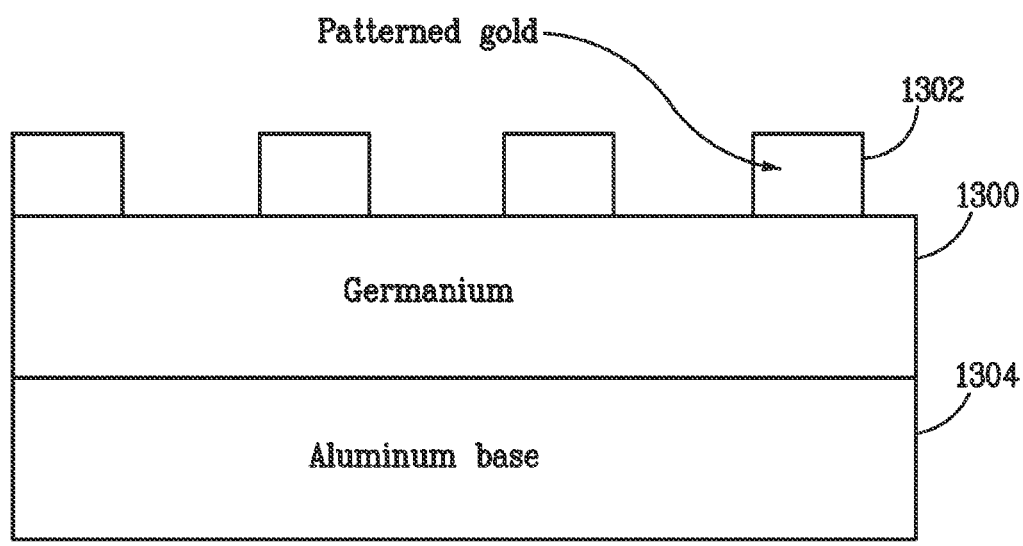
FIGS. 13A and 13B schematically provide an example of a unit cell for an embodiment in which the active layer is germanium, for near-infrared operation.
Figure 13B:
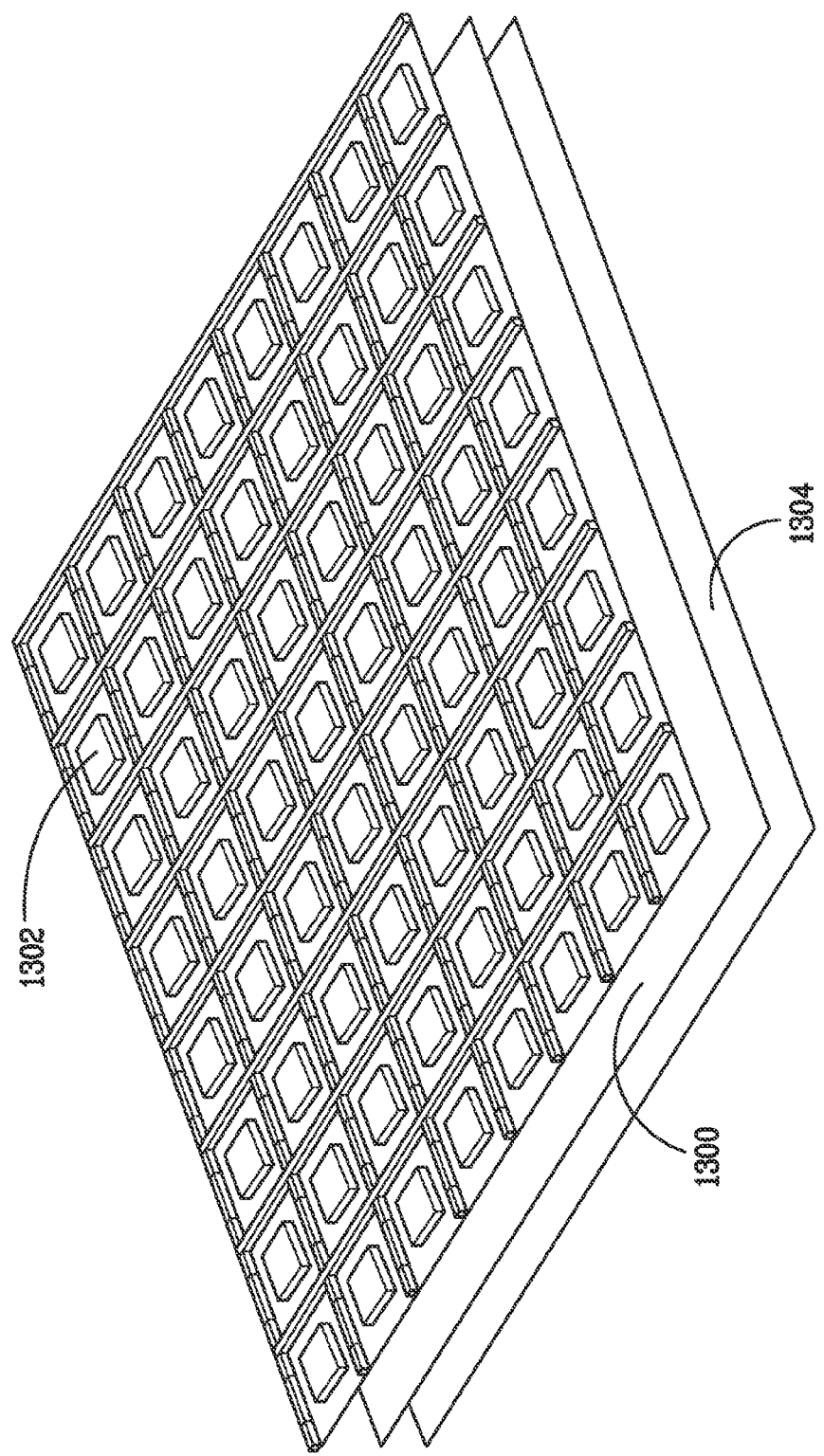

For example, we believe that operation in the near-infrared region (i.e., from wavelengths of about 0.7 μm to about 1.8 μm) would be feasible using a germanium-based detector. FIGS. 13A and 13B schematically provide an example of a unit cell for such a device in, respectively, a cross-sectional side-elevational view and a perspective view. As with the embodiments described above, the embodiment of FIGS. 13A and 13B includes a detection layer 1300 of germanium, 100 nm to 300 nm thick, enclosed between two metal layers, i.e. the patterned gold nanoantenna layer 1302 and an aluminum base layer 1304. Because the device is designed for operation in the near-infrared, the detector layer is quite thin. In the example presented here, the metal top and bottom layers act as contacts.

Because the active layer of the device is thin, the transit time for carriers to reach a metal electrode is very low. Moreover, the capacitance can be kept relatively low by avoiding the use of large continuous metal elements as electrodes. As a consequence, we believe that the switching speed of such a device can be as high as 100 GHz or more. Such a capability is especially significant because the spectral range over which we believe devices of this kind can operate includes the telecommunication wavelengths. If gigahertz and higher switching speeds can be attained, these devices can be useful for telecommunication links.

We designed and simulated a structure of the kind illustrated in FIGS. 13A and 13B, with dimensions selected for operation at 1.5 μm, which lies within the telecommunications wavelength band. It will be seen from FIG. 13B that we used a square loop design, in which each unit cell included a gold square patch within a square loop formed by a unit of a gold grid. The dimensions were as follows: Nanoantenna, 50-nm patterned gold; active layer, 275-nm germanium; base layer, aluminum, thickness arbitrary. The nanoantenna period was 475 nm, each square patch had an edge length of 220 nm, and the grid consisted of gold bars 50 nm wide.

Figure 13C:
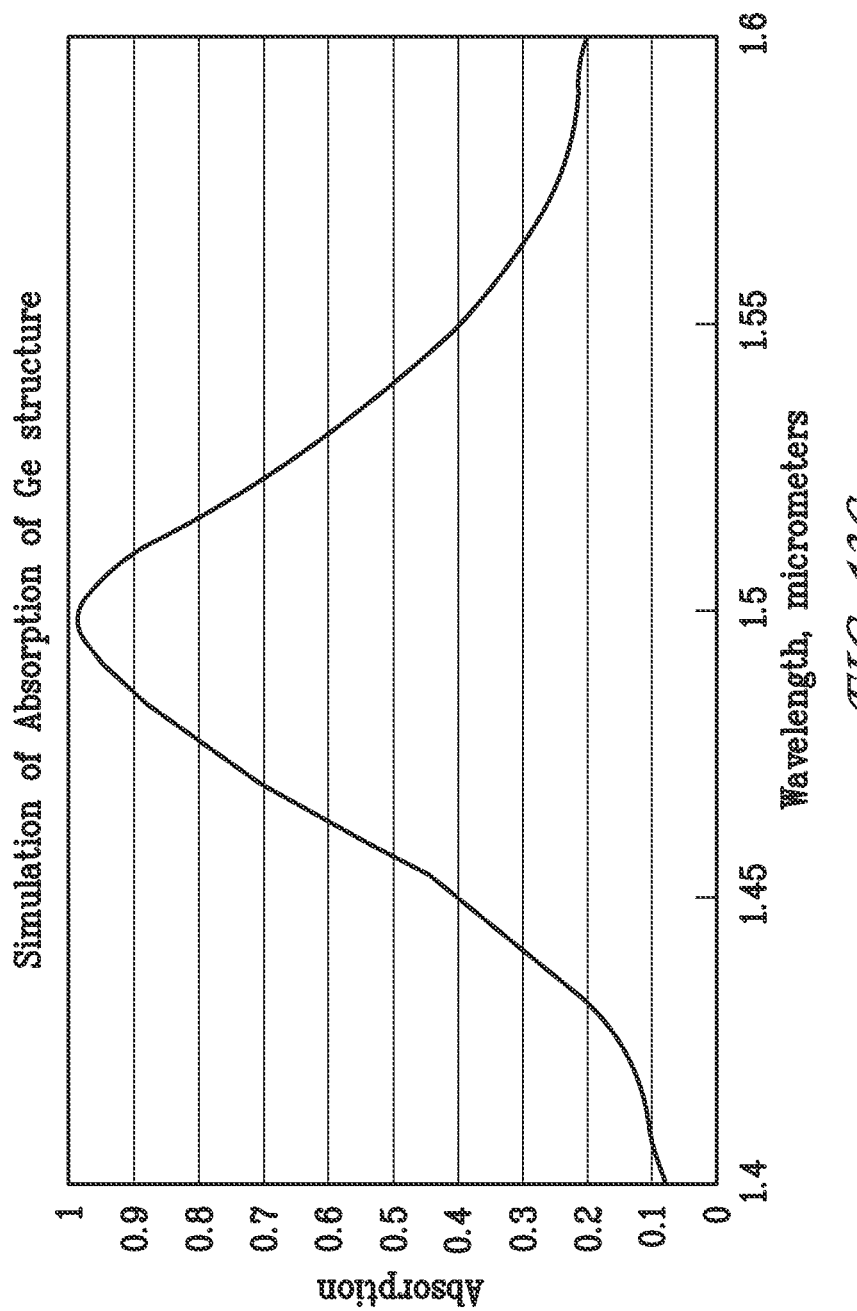
FIG. 13C provides a theoretical absorption spectrum obtained from numerical simulations of the device of FIGS. 13A and 13B.

FIG. 13C provides a numerically computed absorption spectrum of the simulated device. As will be seen in the figure, the device had a theoretical center absorptive wavelength of about 1.5 μm and a bandwidth of about 0.1 μm.

What is claimed:

1. Apparatus comprising a photodetector, the photodetector comprising:
   a semiconductor body;
   a periodically patterned metal nanoantenna disposed on a surface of the semiconductor body; and
   at least one electrode separated from the nanoantenna;
   wherein the semiconductor body comprises an active layer in sufficient proximity to the nanoantenna for plasmonic coupling thereto;
   wherein the nanoantenna is dimensioned to absorb electromagnetic radiation in at least some wavelengths not more than 12 μm that are effective for plasmonic coupling into the active layer; and
   wherein the electrode is part of an electrode arrangement for obtaining a photovoltage or photocurrent in operation under appropriate stimulation.

2. The apparatus of claim 1, wherein the electrode arrangement includes the nanoantenna and at least one backplane electrode.

3. The apparatus of claim 1, wherein the electrode arrangement includes at least one front electrode separated from the nanoantenna and at least one backplane electrode.

4. The apparatus of claim 1, wherein said apparatus is conformed as a focal plane array, the semiconductor body is subdivided into pixels, and the electrode arrangement is conformed to provide an output signal containing image information.

5. The apparatus of claim 1, wherein the semiconductor body is conformed as an nBn or pBp photodetector.

6. The apparatus of claim 1, wherein the active layer is interposed between and adjacent to two layers of semiconductor material having a greater bandgap than the active layer.

7. The apparatus of claim 6, wherein the electrode arrangement comprises a front electrode pattern disposed such that in use it is proximal a radiation source and a back electrode disposed such that in use it is distal the radiation source, and wherein the two layers of greater bandgap material are interposed between the active layer and respectively the front and back electrode patterns.

8. The apparatus of claim 1, wherein the semiconductor body comprises an epitaxially grown stack of multiple semiconductor layers.

9. The apparatus of claim 8, wherein each of the multiple semiconductor layers is a compound of one or more elements selected from (aluminum, indium, gallium) and one or more elements selected from (arsenic, antimony).

10. The apparatus of claim 9, wherein the active layer comprises InAsSb.

11. The apparatus of claim 1, wherein the active layer comprises germanium.

12. The apparatus of claim 1, wherein the nanoantenna comprises a plurality of periodic unit cells, each unit cell comprises one or more unit patterns, and each unit pattern is dimensioned with one or more dimensions selective for a particular peak absorptive wavelength.

13. The apparatus of claim 12, wherein each unit pattern is a square loop pattern having an aperture size, and wherein the aperture size is a said wavelength-selective dimension.

14. The apparatus of claim 12, wherein each unit cell comprises unit patterns of two or more different types, and each type is dimensioned for a respective peak absorptive wavelength.

15. The apparatus of claim 12, wherein the active layer has a composition, the unit patterns have one or more wavelength-selected dimensions, and said composition and said dimensions are chosen to jointly select for a near-infrared peak absorptive wavelength.

16. The apparatus of claim 12, wherein the active layer has a composition, the unit patterns have one or more wavelength-selected dimensions, and said composition and said dimensions are chosen to jointly select for a mid-wave infrared peak absorptive wavelength.

17. The apparatus of claim 1, wherein the nanoantenna is encapsulated in a dielectric material.

18. The apparatus of claim 17, wherein the encapsulated nanoantenna is bonded to a dielectric body.

19. The apparatus of claim 1, wherein the semiconductor body is bonded to a Read-Out Integrated Circuit (ROIC) such that output signals from the electrode arrangement are directed into the ROIC.

20. A method for making a photodetector, comprising:
epitaxially growing a sequence of semiconductor layers on a sacrificial semiconductor substrate to form a semiconductor stack;
bonding the semiconductor stack to a handling substrate;
removing the sacrificial substrate; and
before or after removing the sacrificial substrate, depositing and patterning a metal nanoantenna on the semiconductor stack.

21. The method of claim 20, wherein:
the metal nanoantenna is deposited and patterned before removing the sacrificial substrate;
the method further comprises encapsulating the nanoantenna in a dielectric material, thereby forming an encapsulated layer; and
the bonding step is carried out by bonding the encapsulated layer to the handling substrate.

22. The method of claim 20, wherein:
the method further comprises forming a pattern of metal contacts on a surface of the semiconductor stack;
the handling substrate is a Read-Out Integrated Circuit (ROIC);
the bonding step is carried out by bonding the semiconductor stack to the ROIC such that the metal contacts are electrically connected to the ROIC; and
the metal nanoantenna is deposited and patterned after removing the sacrificial substrate.

23. The method of claim 20, wherein the sacrificial substrate comprises gallium antimonide.

* * * * *